United States Patent [19]

Deguchi

[11] Patent Number: 5,552,730
[45] Date of Patent: Sep. 3, 1996

[54] MOS DIFFERENTIAL VOLTAGE-TO-CURRENT CONVERTER CIRCUIT WITH IMPROVED LINEARITY

[75] Inventor: Koji Deguchi, Tokyo, Japan

[73] Assignee: NEC Corporation, Tokyo, Japan

[21] Appl. No.: 458,907

[22] Filed: Jun. 2, 1995

Related U.S. Application Data

[62] Division of Ser. No. 269,789, Jul. 1, 1994.

[30] Foreign Application Priority Data

Jul. 5, 1993 [JP] Japan ................................. 5-165611
Dec. 20, 1993 [JP] Japan ................................. 5-318871

[51] Int. Cl.$^6$ .................................................. H02H 11/00
[52] U.S. Cl. ............................ 327/103; 327/563; 330/252; 330/253
[58] Field of Search ............................ 327/560, 561, 327/562, 563, 103; 330/250, 251, 252, 253

[56] References Cited

U.S. PATENT DOCUMENTS

| | | | |
|---|---|---|---|
| 3,854,101 | 12/1974 | Muramatsu | 330/30 |
| 4,004,247 | 1/1977 | Van De Plassche | 330/30 D |
| 4,078,206 | 3/1978 | Crowle | 330/253 |
| 4,774,476 | 9/1988 | Ecklund et al. | 330/260 |
| 4,783,602 | 11/1988 | Viswanathan | 327/94 |
| 4,801,891 | 1/1989 | Novosel et al. | 330/253 |
| 4,868,692 | 9/1989 | Nakase et al. | 360/77 |
| 4,961,046 | 10/1990 | De Jager | 323/315 |
| 5,351,011 | 9/1994 | Seevinck et al. | 330/253 |

FOREIGN PATENT DOCUMENTS

| | | |
|---|---|---|
| 0478297 | 4/1992 | European Pat. Off. . |
| 0507388 | 10/1992 | European Pat. Off. . |
| 2663476 | 12/1991 | France . |
| 3734631 | 4/1988 | Germany . |
| 50-36055 | 4/1975 | Japan . |
| 57-46161 | 3/1982 | Japan . |
| 59-229909 | 12/1984 | Japan . |
| 63-44521 | 3/1988 | Japan . |
| 3-163907 | 7/1991 | Japan ................................. 327/563 |

OTHER PUBLICATIONS

Electronic Engineering, No. 677, May 1993, London GB, pp. 35–39 G. Stocchino, "Low Distortion for Instrumentation".

IEEE Solid-State Circuits Conference, vol. 31, Feb. 1988, New York, NY, W. Sansen, et al., "Micropower Monolithic Data-Acquisition System".

IBM Technical Disclosure Bulletin, vol. 9, No. 7, Dec. 1966, "Differential Amplifier".

*Primary Examiner*—Timothy P. Callahan
*Assistant Examiner*—Kenneth B. Wells
*Attorney, Agent, or Firm*—Foley & Lardner

[57] ABSTRACT

A MOS differential voltage-to-current converter circuit has first and second MOS transistors forming a differential pair and a resistor connected between the sources of the first and second MOS transistors. These first and second MOS transistors are connected to the sources of third and fourth MOS transistors, at respective sources. By biasing the third and fourth MOS transistors, with a constant current, differential input voltage is supplied to the gates of the third and fourth MOS transistors. The drain outputs of the third and fourth MOS transistors are respectively connected to first and second signal transmission circuits for transmitting the drain outputs to the gates of the first and second MOS transistors through the first and second signal transmission circuits. With taking the current flowing through the first and second MOS transistors as differential output, a voltage-to-current conversion characteristics not depending upon variable property of the MOS transistors can be obtained.

8 Claims, 22 Drawing Sheets

MOS DIFFERENTIAL VOLTAGE-TO-CURRENT CONVERTER CIRCUIT WITH IMPROVED LINEARITY

This application is a division of application Ser. No. 08/269,789, filed Jul. 1, 1994.

BACKGROUND OF THE INVENTION

1. Field of the Invention

The present invention relates to a MOS voltage-to-current converter circuit employing a field-effect MOS transistor formed on a semiconductor integrated circuit chip. More specifically, the invention relates to a MOS differential voltage-to-current converter circuit which suppresses fluctuation of a mutual conductance.

2. Description of the Related Art

Construction and operation of the conventional MOS differential voltage-to-current converter circuit will be discussed with reference to the drawings. Throughout the disclosure, a field-effect MOS transistor will be simply referred to as "MOSFET", N-channel field-effect MOS transistor will be referred to as "NMOSFET", and similarly, P-channel field-effect MOS transistor will be referred to as "PMOSFET".

Concerning the reference signs to be used in the following disclosure, I, I*, I**, $\Delta$I represent current, V, V*, V**, $\Delta$V represent voltage, R, R*, R** represent resistance, $\beta$, $\beta$* represent gain coefficient of MOSFET, and gm, gm* represent mutual conductance of the differential voltage-to-current converter circuit. *,** represent numerals.

One example of the circuit construction of the conventional differential voltage-to-current converter circuit (hereinafter referred to as "first prior art") is illustrated in FIG. 13. In FIG. 13, $N_1$ and $N_2$ represent first and second NMOSFET, $2R_0$ represents one source resistance (resistance value $2R_0$) mutually connecting the source terminals of $N_1$ and $N_2$. $V_1$ and $V_2$ represent first and second input voltages of the differential voltage-to-current converter circuit, $V_{B1}$ and $V_{B2}$ represent backgate voltages. On the other hand, $I_{01}$ and $I_{02}$ represent first and second constant current sources, respectively. $I_1$ and $I_2$ represent first and second output currents of the differential voltage-current converter circuit, respectively. Note that various equations, numbered (1)–(50), are referenced hereinafter. The definition of each equation is also provided hereinafter, with related equations grouped together following their corresponding discussion.

Here, it is assumed that currents $I_{01}$ and $I_{02}$ of the first and second constant current sources are equal to each other. Double of the current $I_{01}$ or $I_{02}$ is defined as a constant current $I_{00}$ which is expressed by the equation (1). A differential output current $\Delta$I and a differential input voltage $\Delta$V are respectively expressed by the equation (2).

Discussion is now given for an input/output characteristics of the differential input voltage $\Delta$V and the differential output current $\Delta$I in the differential voltage-to-current converter circuit of FIG. 13. Assuming the gain coefficient of the MOSFET is $\beta$, a drain current $I_D$ is expressed by the equation (3) in the saturated range. It should be noted that, in the equation (3), $V_{GS}$ represents a gate-source voltage, $V_T$ represents a threshold voltage. Accordingly, $V_{GS}$ can be expressed by the equation (4).

Applying Kirchhoff's law the loops of $V_1$~$V_{GS1}$~$V_{2R0}$~$V_{GS2}$~$V_2$, the equation (5) can be established. Then, the differential input voltage $\Delta$V can be expressed by the equation (6) where the current flowing through a resistor $2R_0$ between the sources is $I_{R0}$. It should be appreciated that, the gain coefficients $\beta$ of $N_1$ and $N_2$ forming a differential pair in equation (6) are mutually equal.

From Kirchhoff's law, the equation (7-a) can be established with respect to both ends of the resistor $2R_0$. Therefore, the current $I_{R0}$ flowing through the source resistor $2R_0$ is expressed by the equation (7-b). Therefore, first and second output currents $I_1$ and $I_2$ are expressed by the equation (7-c). Substituting the equation (6) with these, the equation (8), which expresses the input/output characteristics of the differential input voltage $\Delta$V, and the differential output current $\Delta$I can be derived.

The input/output characteristics of the differential voltage-to-current converter circuit of the first prior art, which is expressed by the equation (8), is illustrated as curve a in FIG. 14. A reciprocal of the mutual conductance $g_m$ of the differential voltage-to-current converter circuit can be obtained by differentiating $\Delta$V with the differential output current $\Delta$I, and expressed by the equation (9). As shown in FIG. 14, the mutual conductance $g_m$ becomes the maximum value $g_{mmax}$ when the differential input voltage $\Delta$V is 0. At this time, from the equation (8), $\Delta$I becomes 0, the reciprocal of the maximum value $g_{mmax}$ is expressed by the equation (10). It should be appreciated that the maximum value $g_{mmax}$ of the mutual conductance corresponds to the gradient of a tangent b of the input/output characteristics curve a of FIG. 14 at $\Delta$V=0, the tangent b is expressed by:

$$\Delta I = g_{mmax} \times \Delta V$$

A coefficient E expressing non-linearity of the input/output characteristics of the differential voltage-to-current converter circuit is defined by the equation (12-a). Namely, the non-linearity E can be obtained by obtaining a difference between the input/output characteristics curve a and the tangent b with respect to $\Delta$V and by dividing the difference by the value ($g_{mmax} \times \Delta V$) of the tangent b.

Expressing the a rate of $I_{00}$ as double of the current of the first and second current source and the differential output current $\Delta$I as a coefficient $\alpha$ (equation (11)), the non-linearity E can be expressed with the coefficient $\alpha$ and $I_{00}$ in the equation (12-b). A curve in FIG. 15 is a plot of the non-linearity with respect to the differential input voltage $\Delta$V (horizontal axis).

Respective values shown in FIGS. 14 and 15 are derived with taking the constant current $I_{00}$=1 (mA), gain coefficient $\beta$=1×10$^{-3}$(A/V$^2$), the source resistor $R_0$=1 (k$\Omega$). It should be noted that the value (horizontal axis) of the non-linearity E is shown by % in FIG. 15. With reference to FIG. 15, at near the maximum value $I_{00}$ of the differential output current $\Delta$I, the non-linearity E becomes approximately 17%.

$$I_{00} = 2I_{01} = 2I_{02} \qquad (1)$$

$$\Delta I = I_1 - I_2 \qquad (2)$$

$$\Delta V = V_1 - V_2$$

$$I_D = \frac{\beta}{2}(V_{GS} - V_T)^2 \qquad (3)$$

$$V_{GS} = V_T + \sqrt{\frac{2I_D}{\beta}} \qquad (4)$$

$$V_1 - (V_{GS1} + V_{2R0}) - V_2 + V_{GS2} = 0 \qquad (5)$$

-continued $$\Delta V = V_1 - V_2 = V_{GS1} - V_{GS2} + V_{2R0} = \sqrt{\frac{2I_1}{\beta}} - \sqrt{\frac{2I_2}{\beta}} + 2R_0 I_{R0} \quad (6)$$

$$I_1 - I_{R0} = I_{01}, I_2 + I_{R0} = I_{02} \quad \text{(7-a)}$$

$$I_{R0} = \frac{(I_1 - I_2)}{2} = \frac{\Delta I}{2} \quad \text{(7-b)}$$

$$I_1 = \frac{(I_{00} + \Delta I)}{2}, I_2 = \frac{(I_{00} - \Delta I)}{2} \quad \text{(7-c)}$$

$$\Delta V = \sqrt{\frac{I_{00} + \Delta I}{\beta}} - \sqrt{\frac{I_{00} - \Delta I}{\beta}} + R_0 \cdot \Delta I \quad (8)$$

$$\frac{1}{g_m} = \frac{d\Delta V}{d\Delta I} = \frac{1}{2\sqrt{\beta(I_{00} + \Delta I)}} + \frac{1}{2\sqrt{\beta(I_{00} - \Delta I)}} + R_0 \quad (9)$$

$$\frac{1}{g_{mmax}} = \frac{d\Delta V}{d\Delta I} = \frac{1}{\sqrt{I_{00} \cdot \beta}} + R_0 \quad (\Delta I = 0) \quad (10)$$

$$\alpha = \frac{I_{00}}{\Delta I} \quad (11)$$

$$E = \frac{1}{g_{mmax}} \frac{\Delta I}{\Delta V} - 1 \quad \text{(12-a)}$$

$$= \frac{1 + R_0 \sqrt{I_{00}\beta}}{\sqrt{\alpha^2 + \alpha} - \sqrt{\alpha^2 - \alpha} + R_0 \sqrt{I_{00}\beta}} - 1 \quad \text{(12-b)}$$

wherein $$(-I_{00} \leq \Delta I \leq I_{00})$$

$$\left( \sqrt{\frac{2 \cdot I_{00}}{\beta}} - R_0 \cdot I00 \leq \Delta V \leq \sqrt{\frac{2 \cdot I_{00}}{\beta}} + R_0 \cdot I_{00} \right)$$

From FIGS. 14 and 15, it should be appreciated that the absolute value of the non-linearity E is increased according to increasing of the differential output current $\Delta I$ associated with increasing of the differential input voltage $\Delta V$. This is caused due to $I_D$–$V_{GS}$ characteristics of the MOSFET, in which a drain current $I_n$ does not vary in proportion to variation of a gate-source voltage $V_{GS}$. In other words, as expressed in the equation (8), this is caused due to the fact that the differential input voltage $\Delta V$ and the voltage $V_{2R0}$ at opposite ends of the source resistor (accordingly, the differential output current $\Delta I$) are not proportional to each other.

The characteristics of the above-mentioned differential voltage-to-current converter circuit is similarly applicable for the case where the first and second NMOSFETs are replaced with PMOSFETs.

FIGS. 16 shows another example of a circuit construction of the conventional differential voltage-to-current converter circuit in which first and second resistors $R_{01}$ and $R_{02}$ are connected in common (hereinafter referred to as "second prior art"). As shown in FIG. 16, the second prior art is constructed by connecting one end of first and second resistors $R_{01}$ and $R_{02}$ to source terminals of first and second MOSFETs $N_1$ and $N_2$, respectively, and connecting one constant current source $I_0$ to a common junction of the other end of first and second resistors $R_{01}$ and $R_{02}$. $V_1$ and $V_2$ denote first and second inputs voltages, $V_{B1}$ and $V_{B2}$ denote a backgate terminal voltages, and $I_1$ and $I_2$ denote the first and second output currents.

The resistance values of the first and second resistors $R_{01}$ and $R_{02}$ are assumed to be equal to each other. Then, the source resistance $R_{00}$ is defined as expressed in the equation (13-a). Also, the differential output current $\Delta I$ is expressed by the equation (13-b).

The differential input voltage $\Delta V$ in the differential voltage-to-current converter circuit of FIG. 16 is derived in the similar manner to the foregoing first prior art by replacing the source resistor $2R_0$ with $2_{00}$ and $I_{00}$ in the equation (1) with $I_0$, and thus is expressed by the equation (14). The input/output characteristics of the second prior art is illustrated in FIG. 17, and the non-linearity E defined by the following equation (18) is illustrated in FIG. 18.

$$R_{00} = R_{01} = R_{02} \quad \text{(13-a)}$$

$$\Delta I = I_1 - I_2 \quad \text{(13-b)}$$

$$\Delta V = V_1 - V_2 = \sqrt{\frac{I_0 + \Delta I}{\beta}} - \sqrt{\frac{I_0 - \Delta I}{\beta}} + R_{00} \cdot \Delta I \quad (14)$$

$$\frac{1}{g_m} = \frac{d\Delta V}{d\Delta I} = \frac{1}{2\sqrt{\beta(I_0 + \Delta I)}} + \frac{1}{2\sqrt{\beta(I_0 - \Delta I)}} + R_{00} \quad (15)$$

$$\frac{1}{g_{mmax}} = \frac{d\Delta V}{d\Delta I} = \frac{1}{\sqrt{I_0 \cdot \beta}} + R_{00} \quad (\Delta I = 0) \quad (16)$$

$$\alpha = \frac{I_0}{\Delta I} \quad (17)$$

$$E = \frac{1}{g_{mmax}} \frac{\Delta I}{\Delta V} - 1 = \quad (18)$$

$$\frac{1 + R_{00} \sqrt{I_0\beta}}{\sqrt{\alpha^2 + \alpha} - \sqrt{\alpha^2 - \alpha} + R_{00} \sqrt{I_0\beta}} - 1$$

wherein $$(-I_0 \leq \Delta I \leq I_0)$$

$$\left( \sqrt{\frac{2 \cdot I_0}{\beta}} - R_{00} \cdot I0 \leq \Delta V \leq \sqrt{\frac{2 \cdot I_0}{\beta}} + R_{00} \cdot I_0 \right)$$

Respective values in FIGS. 17 and 18 are derived with assumption of constant current source $I_0=1$ (mA), gain coefficient $\beta=1\times10^{-3}$ (A/V$^2$), source resistance $R_{00}=1$ (KΩ).

From FIGS. 17 and 18, it should be appreciated that the absolute value of the non-linearity E is increased according to increasing of the differential output current $\Delta I$ associated with increasing of the differential input voltage $\Delta V$. This is caused due to $I_D$–$V_{GS}$ characteristics of the MOSFET, in which a drain current $I_n$ does not vary in proportion to variation of a gate-source voltage $V_{GS}$. In other words, as expressed in the equation (14), this is caused due to the fact that the differential input voltage $\Delta V$ and the voltage $V_R$ at opposite ends of the source resistor (accordingly, the differential output current $\Delta I$) are not proportional to each other.

The characteristics of the above-mentioned the differential voltage-to-current converter circuit is similarly applicable for the case where the first and second NMOSFETs are replaced with PMOSFETs.

FIG. 19 shows a circuit construction of the differential voltage-to-current converter circuit disclosed in Japanese Unexamined Patent Publication No. 57-46161 (hereinafter referred to as "third prior art). As shown in FIG. 19, the third prior art is designed for eliminating non-linearity of an amplifier element by combination of a differential amplifier and bipolar current-mirror circuit having two outputs.

In the third prior art, assuming the current-mirror circuit and the constant current source are both ideal, the relationship between the differential output current $\Delta I$ and the differential input voltage $\Delta V$ can be expressed by the equation (21). The input/output characteristics is shown in FIG. 20. The non-linearity E (expressed by the equation (22)) of the differential voltage-to-current converter circuit of the third prior art is illustrated in FIG. 21. From FIG. 21, the non-linearity E becomes 0 in a range of the differential input voltage $\Delta V$ being $\pm RI_0/3$. Therefore, a linearity can be improved.

However, in the third prior art, in order to take the current out, it becomes necessary to add a new circuit, such as an output side transistor added for the bipolar current-mirror circuit. This circuit varies signals in non-linear fashion according to variation of the input current. Therefore, the non-linearity of the voltage-to-current converter circuit is increased beyond 0 in the equation (22) to degrade the effect in improvement of the linearity.

As shown in FIGS. 20, 21, with the circuit construction in the third prior art, the range of the differential current, in which the non-linearity can be reduced, is in a range of ⅓ of the constant current $I_0$. Accordingly, in order to obtain the output comparable with those in the prior arts 1 and 2, the constant current has to be three time grater, or, in the alternative, a size ratio between the bipolar transistors-forming the mirror-current circuit has to be selected appropriately.

$$\Delta V = V_1 - V_2$$

$$R = 2R_{01} = 2R_{02}$$

$$i_1 + i_2 = I_0, \ i_3 + i_4 = I_0/3, \ i_5 + i_6 = I_0/3 \quad (19)$$

$$i_1 = \frac{I_0}{2} + \frac{\Delta V}{2 \cdot R}, \quad i_2 = \frac{I_0}{2} - \frac{\Delta V}{2 \cdot R}, \quad (20)$$

$$i_5 = \frac{I_0}{6} + \frac{\Delta V}{2 \cdot R}, \quad i_6 = \frac{I_0}{6} - \frac{\Delta V}{2 \cdot R}$$

$$\Delta I = i_5 - i_6 = \frac{\Delta V}{R} \quad (21)$$

$$\frac{1}{g_m} = \frac{1}{g_{mmax}} \quad \frac{d\Delta V}{d\Delta I} = R \quad (\Delta I = 0)$$

$$E \frac{1}{g_{mmax}} \quad \frac{\Delta I}{\Delta V} - 1 = 0 \quad (22)$$

wherein $$\left( -\frac{I_0}{3} \leq \Delta I \leq \frac{I_0}{3} \right)$$

$$\left( -\frac{R \cdot I_0}{3} \leq \Delta I \leq \frac{R \cdot I_0}{3} \right)$$

In FIG. 22, the construction of the differential amplifier disclosed in Japanese Unexamined Utility Model Publication No. 63-44521 (hereinafter referred to as "fourth prior art"). In FIG. 23, the input/output characteristics of the fourth prior art is illustrated.

In the fourth prior art, for respective first and second bipolar transistors, third and fourth bipolar transistors, bases and emitters of which are mutually connected, are employed. By applying the constant current to this, the linearity of the differential amplifier circuit is improved in the range of $\pm \alpha I_{EE}$ 12 of the output current.

As shown in FIG. 22, in the circuit construction of the fourth prior art, direct current is constantly applied to input signal sources $V_1$ and $V_2$ from emitters of fifth and sixth transistors $Q_4$ and $Q_5$. Therefore, the input signal sources $V_1$ and $V_2$ require drive performance for supplying the supplied current.

FIGS. 24 and 25 show a circuit construction of a differential amplifier disclosed in Japanese Unexamined Patent Publication No. 59-229909 (hereinafter referred to as "fifth prior art"). As shown, the differential amplifier of the fifth prior art is constructed by contacting the drain of a first FET forming differential pair to a load, the drain of a second FET forming the differential pair to the source of a third FET, and the gate of the third FET to a junction between the drain and the load of the first FET, and the drain of the third FET to the load.

In the fifth prior art, the relationship between the input voltage and the output voltage of the differential amplifier in the range where the mutual conductance $g_{m1}$ to $g_{m4}$ of the FETs (M1 to M4) satisfy the condition expressed in the equation (23), becomes as expressed in the equation (24). Then, the linearity of the input/output characteristics can be improved.

$$\frac{g_{m4}}{g_{m1}} = \frac{g_{m3}}{g_{m2}} \quad (23)$$

$$g_{m1} = g_{m2}$$

$$V_{out} = \frac{1}{2} \quad \frac{g_{m2}}{g_{m5}} \ V_{in} \quad (24)$$

The condition defined in the equation (23) with respect to the differential amplifier of the fifth prior art can be only satisfied by a fine signal alternating operation near a certain direct current operation point of the circuit (in the case where amplitude of the voltage at respective points in the circuit is small).

In the MOS differential voltage-to-current converter circuit in the foregoing first, second and fifth prior arts, a problem in degradation of the linearity of the input/output characteristics according to increasing of the differential output current $\Delta I$ associated with increasing of the differential input voltage $\Delta V$ and narrowing of a dynamic range, is encountered. There is further encountered a problem in increasing of non-linearity due to influence of variation of the properties of MOSFET, such as non-linearity of $I_D$–$V_{GS}$ characteristics, fluctuation of gain coefficient β, variation of a threshold voltage $V_T$ due to a backgate effect, variation of $I_D$–$I_{GS}$ characteristics up to MOS saturation range due to short channel effect and so forth.

The third prior art is capable of reducing non-linearity of the differential amplifier circuit by combination of the differential amplifier circuit and the current-mirror circuit with two outputs employing the bipolar process. However, new circuit is required for taking the current out. Also, the amplitude of the differential output current is merely ⅓ of the current value $I_0$ of the constant current source at the greatest.

Accordingly, in the third prior art, it becomes necessary to provide the constant current $I_0$ three times greater in order to obtain comparable output to the first and second prior arts, or to appropriately adjust the size ratio of the bipolar transistors forming the current-mirror circuit. Therefore, there is encountered a problem in difficulty in reducing consumed current in the circuit construction of the third prior art.

Moreover, in the circuit construction of the third prior art, the currents flowing through the transistor of the bipolar current-mirror circuit and the differential MOSFET influence each other. For instance, since an Early voltage $V_A$ of the bipolar transistor is typically smaller than the Early voltage $V_A$ of the MOS transistor, the variation magnitude of the collector currents of the transistors $Q_1$ and $Q_2$ and the drain current of $N_1$ and $N_2$ in FIG. 19 becomes greater than that in the case where MOS transistors are employed as all transistors. Therefore, it becomes difficult to design the size and so forth of the transistor independently.

Furthermore, the third prior art comprises the MOS transistors and the bipolar transistors. For fabricating these different types of transistors on the common semiconductor chip, production process is inherently increased to cause rising of the production cost.

Next, in the circuit construction of the foregoing fourth prior art, it is required the direct current constantly flowing into the input signal source and thus requires a driving performance to supply the current to the input signal source. Also, the performance of the whole circuit is significantly influenced by the external circuit (power source). Therefore, this circuit encounters a problem in difficulty of handling.

In the differential amplifier of the fifth prior art, the condition expressed by the equation (23) is only satisfied by a fine signal alternating operation near a certain direct current operation point of the circuit (in the case where amplitude of the voltage at respective points in the circuit is small) and cannot be satisfied when amplitude of the voltage is large.

SUMMARY OF THE INVENTION

Therefore, it is an object of the present invention to provide a MOS differential voltage-to-current converter circuit which can improve linearity by avoiding increasing of non-linearity due to various property of MOSFETs of a differential pair in a range of predetermined differential input voltage.

Another object of the invention is to provide a MOS differential voltage-to-current converter circuit, in which a mutual conductance is determined only by the resistance value $2R_0$ or $(R_{01}+R_{02})$ between source (or drain) terminals of the differential pair NOSFET.

A MOS differential voltage-to-current converter circuit has first and second MOS transistors forming a differential pair and a resistor connected between the sources of the first and second MOS transistors. These first and second MOS transistors are connected to the sources of third and fourth MOS transistors, at respective sources. By biasing the third and fourth MOS transistors, with a constant current, differential input voltage is supplied to the gates of the third and fourth MOS transistors. The drain outputs of the third and fourth MOS transistors are respectively connected to first and second signal transmission circuits for transmitting the drain outputs to the gates of the first and second MOS transistors through the first and second signal transmission circuits. With taking the current flowing through the first and second MOS transistors as a differential output, a voltage-to-current conversion characteristics not depending upon variable property of the MOS transistors can be obtained.

According to the first aspect of the invention, a MOS differential voltage-to-current converter circuit includes first and second MOS transistors. A resistor is connected between the sources of the first and second MOS transistors. A first constant current source supplies operation current for the first and second MOS transistors. Third and fourth MOS transistors have sources respectively connected to the source of the first and second MOS transistors and receive a differential input voltage at the gates thereof. Second and third constant current sources supply operation currents for the third and fourth MOS transistors, and first and second signal transmitters transmit drain outputs of the third and fourth MOS transistors to the gates of the first and second MOS transistors for taking the current flowing through the first and second MOS transistors as a differential output.

According to the second aspect of the invention, a MOS differential voltage-to-current converter circuit includes first and second MOS transistors. A resistor is connected between the sources of the first and second MOS transistors. A first constant current source supplies operation current for the first and second MOS transistors. Third and fourth MOS transistors have sources respectively connected to the source of the first and second MOS transistors and receive a differential input voltage at the gates thereof. A first differential amplifier circuit receives a gate input and a drain output of the third MOS transistor as inputs and applies an output as the differential output to the gate of the first MOS transistor, and a second differential amplifier circuit receives a gate input and a drain output of the fourth MOS transistor as inputs and applies an output as the differential output to the gate of the second MOS transistor for taking the current flowing through the first and second MOS transistors as a differential output.

According to the third aspect, of the invention, a MOS differential voltage-to-current converter circuit includes first and second MOS transistors. A resistor is connected between the drains of the first and second MOS transistors. A first constant current source supplies operation current for the first and second MOS transistors. Third and fourth MOS transistors have sources respectively connected to the drain of the first and second MOS transistors and receive a differential input voltage at the gates thereof. Second and third constant current sources supply operation currents for the third and fourth MOS transistors, and first and second signal transmitters transmit drain outputs of the third and fourth MOS transistors to the gates of the first and second MOS transistors for taking the current flowing through the first and second MOS transistors as a differential output.

According to the fourth aspect of the invention, a MOS differential voltage-to-current converter circuit includes first and second MOS transistors. A resistor is connected between the drains of the first and second MOS transistors. A first constant current source supplies operation current for the first and second MOS transistors. Third and fourth MOS transistors have sources respectively connected to the drains of the first and second MOS transistors and receive a differential input voltage at the gates thereof. A first differential amplifier circuit receives a gate input and a drain output of the third MOS transistor as inputs and applies an output as the differential output to the gate of the first MOS transistor and a second differential amplifier circuit receives a gate input and a drain output of the fourth MOS transistor as inputs and applies an output as the differential output to the gate of the second MOS transistor for taking the current flowing through the first and second MOS transistors as a differential output.

According to the fifth aspect of the invention, a MOS differential voltage-to-current converter circuit includes first and second MOS transistors. A resistor is connected between the drains of the first and second MOS transistors. A first constant current source supplies operation current for the first and second MOS transistors. Third and fourth MOS transistors have sources respectively connected to the drains of the first and second MOS transistors and receive a differential input voltage at the gates thereof. A first current-mirror circuit receives the drain output of the third MOS transistor as a current input and has a current output terminal connected to the gate of the first MOS transistor and a second current-mirror circuit receives the drain output of the fourth MOS transistor as a current input and has a current output terminal connected to the gate of the second MOS transistor for taking the current flowing through the first and second MOS transistors as a differential output.

In the preferred construction, the first and second signal transmitters may comprise one of an amplifier circuit, an attenuation circuit and a voltage follower circuit.

BRIEF DESCRIPTION OF THE DRAWINGS

The present invention will be understood more fully from the detailed description given herebelow and from the accompanying drawings of the preferred embodiment of the invention, which, however, should not be taken to be limitative to the present invention, but are for explanation and understanding only.

In the drawings.

DESCRIPTION OF THE PREFERRED EMBODIMENT

The preferred embodiments of a MOS differential voltage-to-current converter circuit according to the present invention will be discussed hereinafter with reference to the accompanying drawings.

FIGS. 1 to 4 show a circuit construction of the first embodiment of the MOS differential voltage-to-current converter circuit of the present invention, and an input/output characteristics thereof.

Figure 1:
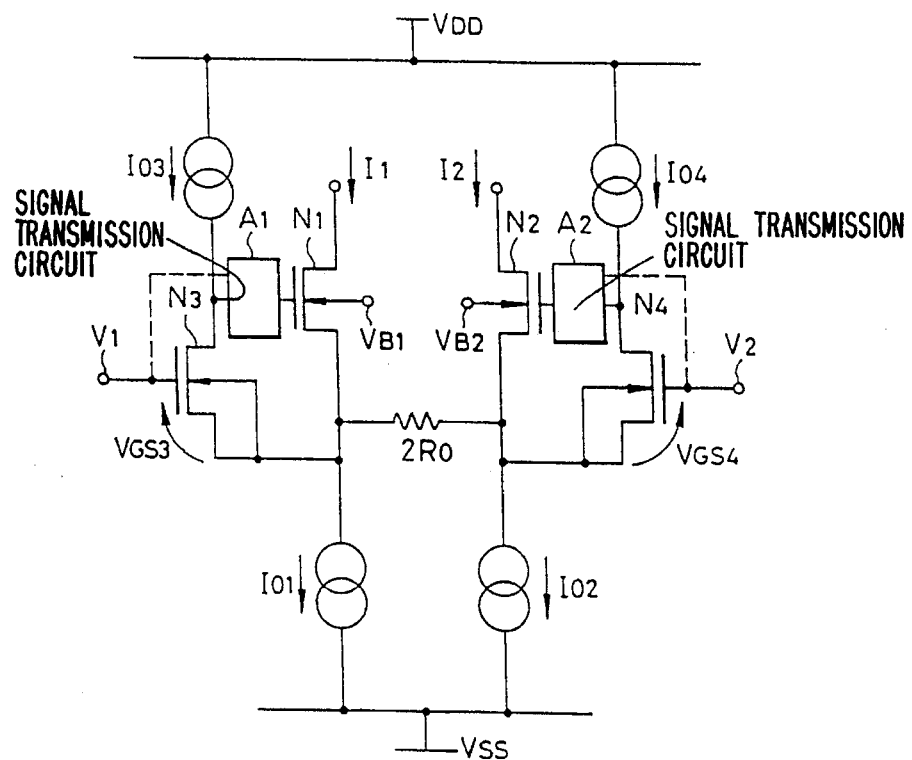
FIG. 1 is an illustration showing a circuit construction of the first embodiment of a sink type differential voltage-to-current converter circuit according to the present invention.
Figure 2:
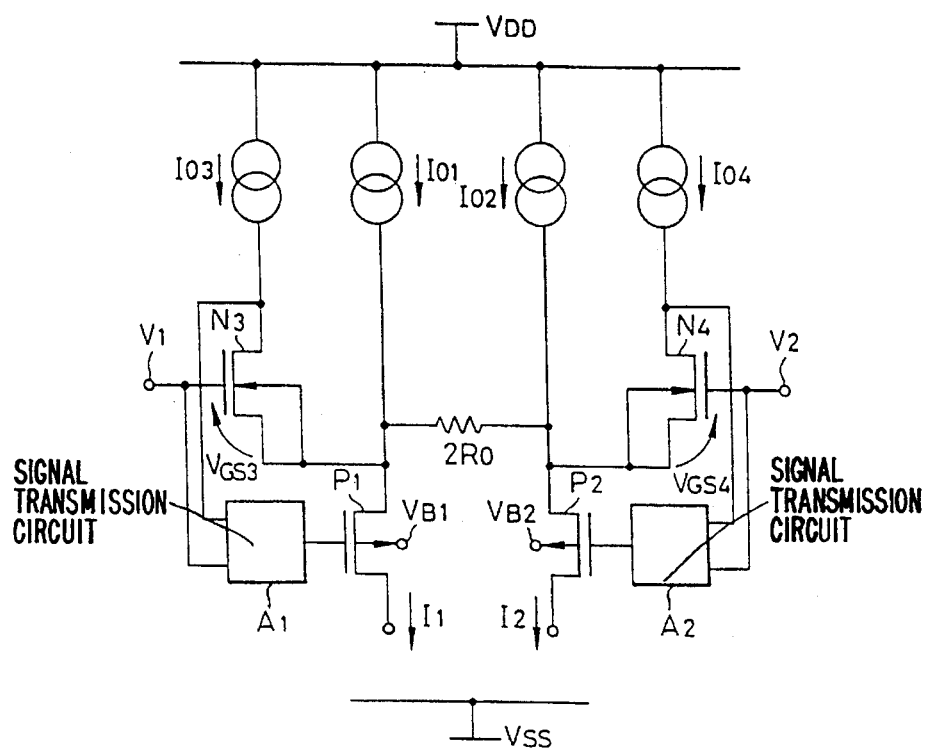
FIG. 2 is an illustration showing a circuit construction of the first embodiment of a source type differential voltage-to-current converter circuit according to the present invention.

As shown in FIGS. 1 and 2, respective source terminals of first and second MOSFETs ($N_1$ and $N_2$ or $P_1$ and $P_2$) forming a differential pair in this embodiment are connected to first and second constant current sources $I_{01}$ and $I_{02}$. Between the source terminals of the first and second MOSFETs, one source resistor $2R_0$ is connected.

FIG. 1 shows the circuit construction of a sink type MOS differential voltage-to-current converter circuit and FIG. 2 shows the circuit construction of a source type MOS differential voltage-to-current converter circuit.

Figure 13:
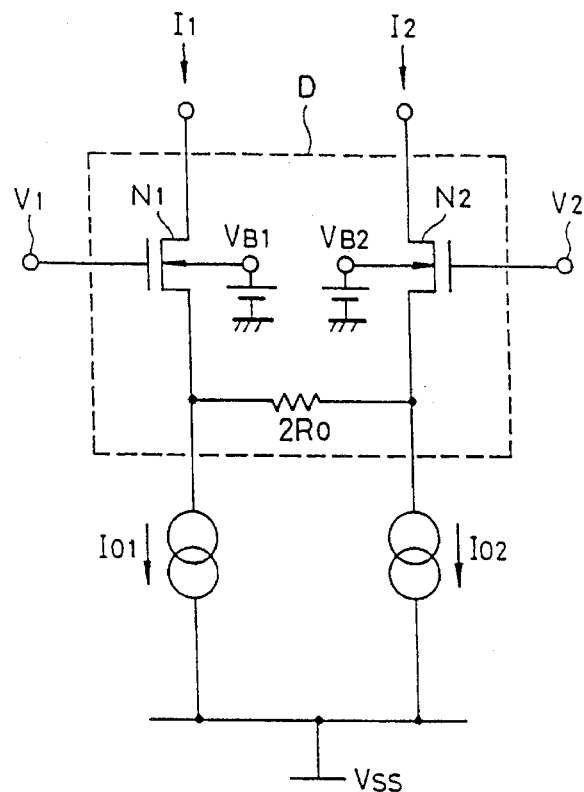
FIG. 13 is an illustration of the circuit construction of the first prior art.
Figure 14:
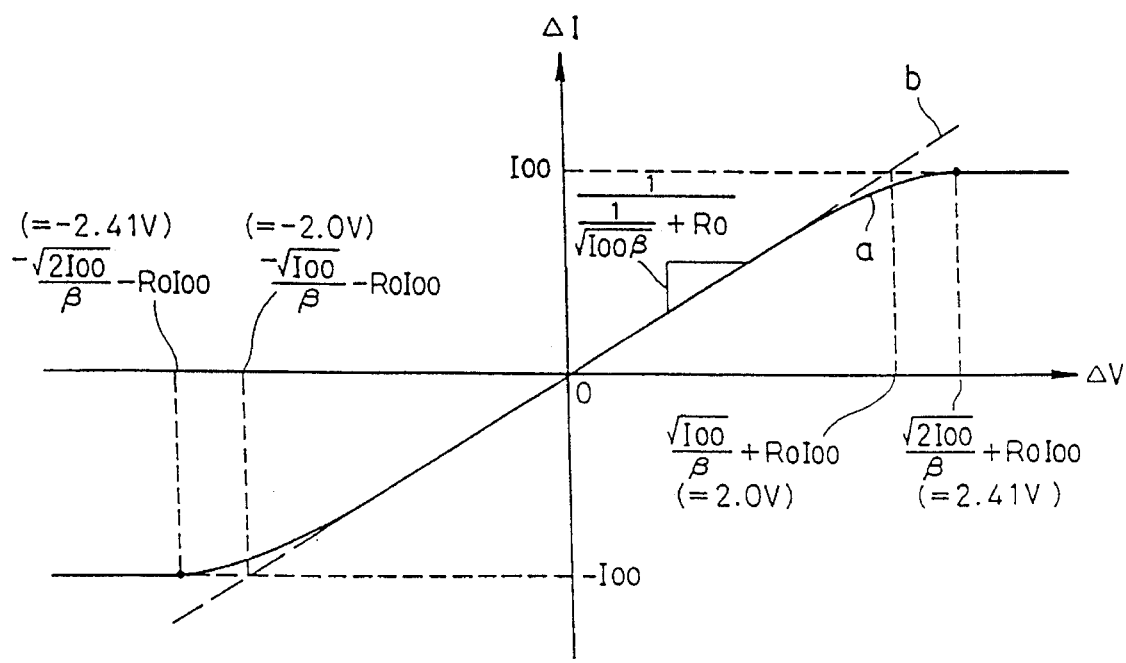
FIG. 14 is an illustration showing an input/output characteristics of the first prior art.
Figure 15:
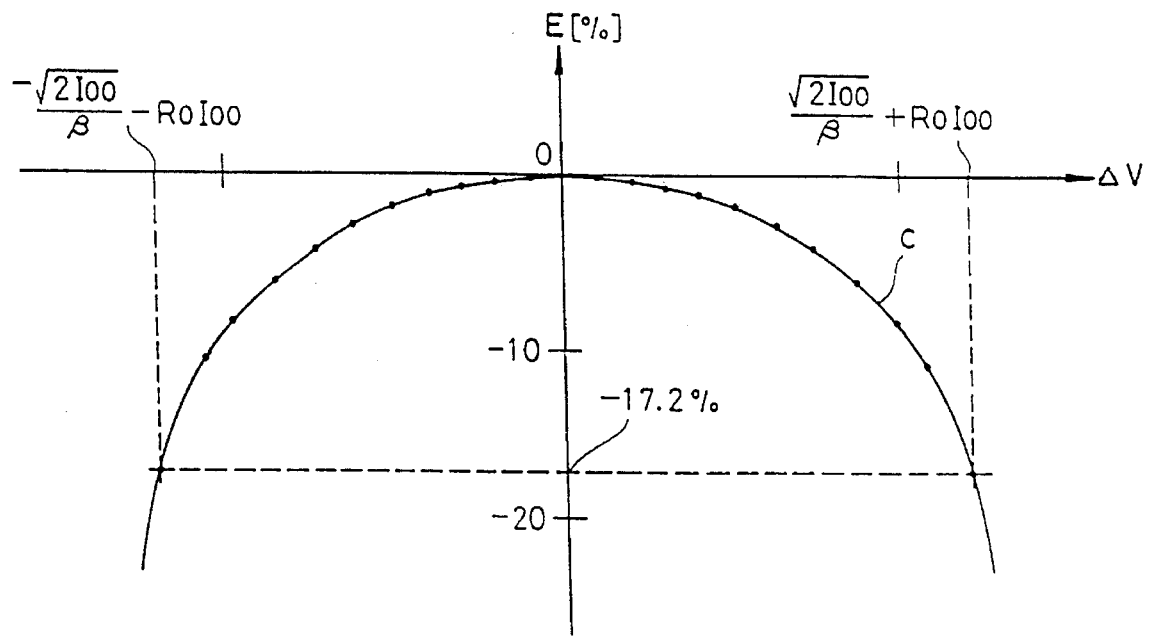
FIG. 15 is an illustration showing a non-linear characteristics of the first prior art.

In FIGS. 1 and 2, the circuit elements performing substantially the same functions to those in the first prior art illustrated in FIG. 13 will be represented by the same reference numerals. $N_3$ and $N_4$ of FIGS. 1 and 2 denote third and fourth NMOSFETs, and $A_1$ and $A_2$ denote first and second signal transmission circuits.

Figure 26:
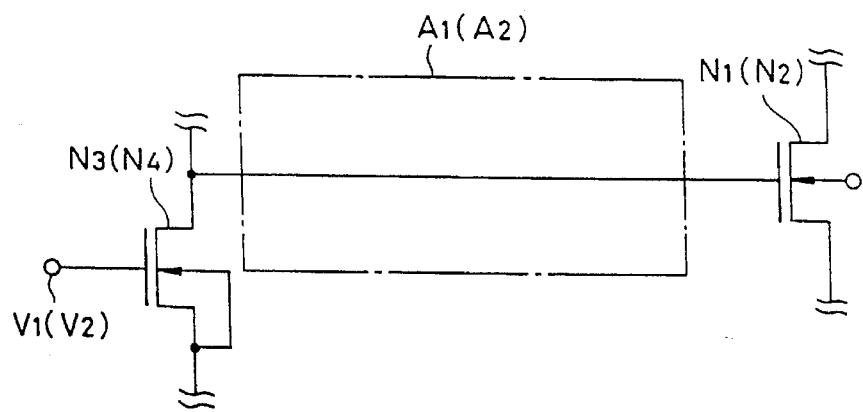
FIG. 26 is an illustration showing one embodiment of a signal transmission circuit to be employed in the first and second embodiment of the invention.
Figure 27:
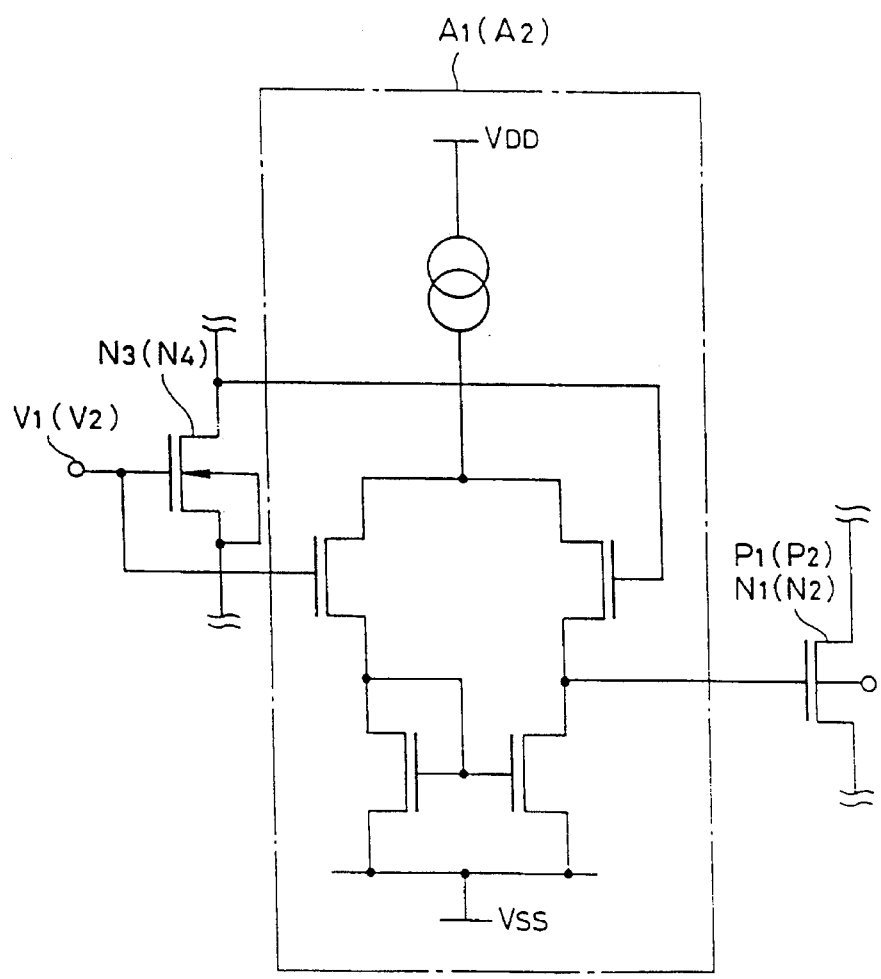
FIG. 27 is an illustration showing another embodiment of a signal transmission circuit to be employed in the first and second embodiment of the invention.

As the signal transmission circuits $A_1$ and $A_2$ in FIG. 1, circuit constructions illustrated in FIGS. 26 and 27 can be employed On the other hand, as the signal transmission circuits $A_1$ and $A_2$ in FIG. 2, the circuit illustrated in FIG. 27 may be employed. As the constant current source of FIG. 1, various current-mirror circuits illustrated in FIGS. 30 to 33 may be employed.

Hereinafter, the construction and operation of the MOS differential voltage-to-current converter circuit constructed by employing direct connection of FIG. 26 in the first and second signal transmission circuits $A_1$ and $A_2$ in FIG. 1.

As shown in FIG. 1, the third and fourth constant current sources $I_{03}$ and $I_{04}$ are connected to the drain terminals of MOSFET $N_3$ and $N_4$, respectively for maintaining the gate-source terminal voltages $V_{GS3}$ and $V_{GS4}$ of $N_3$ and $N_4$ constant. The source terminals of $N_3$ and $N_4$ are respectively connected to the source terminals of $N_1$ and $N_2$ to maintain the voltage between the first input terminal $V_1$ and the source terminal of $N_1$ and the voltage between the second input terminal $V_2$ and the source terminal of $N_2$ constant. The drain terminals of $N_3$ and $N_4$ are respectively connected to the gate terminals of $N_1$ and $N_2$.

It should be noted that the following condition is established with respect to the constant current sources $I_{01}$, $I_{02}$, $I_{03}$ and $I_{04}$.

$$|I_{03}| \leq |I_{01}|$$

$$|I_{04}| \leq |I_{02}|$$

Under the condition set forth above, the operation of the differential voltage-to-current converter circuit of FIG. 1 will be discussed hereinafter. A current which is double of the current of first or second constant current source $I_{01}$ or $I_{02}$ is assumed as $I_{00}$ (equation (25-a)). Also, a current double of the current of the third or fourth constant current source $I_{03}$ or $I_{04}$ is assumed as $I_{00}$ (equation (25-b)). The differential input voltage $\Delta V$ can be derived from a difference of the first and second input terminal voltages $V_1$ and $V_2$ (equation (26)).

The voltage at opposite ends of the source resistor $2R_0$ is expressed by $\Delta V_R$. Then, in the loop of $V_1 \sim V_{GS3} \sim \Delta V_R \sim V_{GS4} \sim V_2$, the equation (28-a) can be established from Kirchhoff's law. The gate-source terminal voltages $V_{GS3}$ and $V_{GS4}$ of NMOSFET $N_3$ and $N_4$ can be expressed by the equation (27) in the saturation region. Here, $V_{T3}$ and $V_{T4}$ are threshold voltages of $N_3$ and $N_4$.

To the drain terminals of $N_3$ and $N_4$, constant currents flow from respective constant current sources $I_{03}$ and $I_{04}$. Therefore, as can be appreciated from the equation (27), the gate-source terminal voltages $V_{GS3}$ and $V_{GS4}$ become constant. Substituting the equation (27) with $V_{GS3}$ and $V_{GS4}$ of the equation (28-a), the equation (28-b) can be established.

Values in the parenthesis of the equation (28-b), namely ($V_{GS3} - V_{GS4}$), becomes a constant value independent of the differential input voltage $\Delta V$. Expressing the term in the parenthesis as $-b$, $\Delta V_R$ can be expressed with a linear equation of the differential input voltage $\Delta V$. In this case, the constant b is an offset voltage.

In the case where circuit elements arranged at symmetrical positions have the same characteristics, the currents of the third and fourth constant current sources $I_{03}$ and $I_{04}$, the gains $\beta_3$ and $\beta_4$, the threshold voltages $V_{T3}$ and $V_{T4}$ become mutually equal to each other, respectively. Therefore, $V_{GS3}$ and $V_{GS4}$ match to each other. Therefore, the constant b in the equation (28-c) becomes 0. Then, the voltage $\Delta V_R$ becomes equal to the differential input voltage $\Delta V$ (equation (32-a)).

Next, assuming the current flowing through the resistor $2R_0$ is $I_{R0}$, the equation (29-a) can be established from the Kirchhoff's law with respect to the opposite ends of the resistor $2R_0$. Form this the differential output current $\Delta I$ can be expressed by the equation (30-a).

With respect to the voltage $\Delta V_R$ at opposite ends of the resistor $2R_0$, $I_{R0}$ can be derived from the equation (29-b). When, the equation (28-b) is employed as $\Delta V_R$, the equation (29-c) can be established. Substituting the equation (30-a) with the equation (29-c), the differential output current $\Delta I$ can be expressed by the equation (30-b). As can be appreciated from the equation (30-b), the differential output current $\Delta I$ is in a linear relationship with the differential input voltage $\Delta V$. This relationship can be expressed by the equation (30-c). Here, constants c and d are respectively derived from the equation (30-d) and the constant b represents ($-V_{GS3} + V_{GS4}$) similarly to (28-d). It should be noted that the constant c represents the mutual conductance and the constant d is an offset current.

With respect to $I_{03}$ and $I_{04}$ satisfying Kirchhoff's law at opposite ends of the resistor $2R_0$, the drain voltages of NMOSFETs $N_3$ and $N_4$ are determined and applied to the gate terminals of the differential pair $N_1$ and $N_2$.

$$I_{00} = 2 \cdot I_{01} = 2 \cdot I_{02} \tag{25-a}$$

$$I_{00}' = 2 \cdot I_{00} = 2 \cdot I_{04} \tag{25-b}$$

$$\Delta V = V_1 - V_2 \tag{26}$$

$$V_{GS3} = \sqrt{\frac{2 \cdot I_{03}}{\beta_3}} + V_{T3}, \; V_{GS4} = \sqrt{\frac{2 \cdot I_{04}}{\beta_4}} + V_{T4} \tag{27}$$

$$\Delta V_R = V_1 - V_{GS3} - V_2 + V_{GS4} \tag{28-a}$$

$$= V_1 - V_2 - \left( \sqrt{\frac{2 \cdot I_{03}}{\beta_3}} + V_{T3} - \sqrt{\frac{2 \cdot I_{04}}{\beta_4}} - V_{T4} \right) \tag{28-b}$$

$$= \Delta V + b \; (b: \text{constant}) \tag{28-c}$$

$$b = \left( \sqrt{\frac{2 \cdot I_{03}}{\beta_3}} + V_{T3} - \sqrt{\frac{2 \cdot I_{04}}{\beta_4}} - V_{T4} \right) \tag{28-d}$$

$$I_1 = I_{01} - I_{03} + I_{R0}, \; I_2 = I_{02} - I_{04} - I_{R0} \tag{29-a}$$

-continued $$I_{R0} = \frac{\Delta V_R}{2R_0} \quad (29\text{-}b)$$

$$= \frac{\Delta V}{2R_0} - \frac{1}{2R_0} - \left( \sqrt{\frac{2 \cdot I_{03}}{\beta_3}} + V_{T3} - \sqrt{\frac{2 \cdot I_{04}}{\beta_4}} - V_{T4} \right) \quad (29\text{-}c)$$

$$\Delta I = I_1 - I_2$$

$$= I_{01} - I_{02} - I_{03} + I_{04} + 2I_{R0} \quad (30\text{-}a)$$

$$= I_{01} - I_{02} - I_{03} + I_{04} + \frac{\Delta V}{R_0} - \frac{1}{R_0} - \quad (30\text{-}b)$$

$$\left( \sqrt{\frac{2 \cdot I_{03}}{\beta_3}} + V_{T3} - \sqrt{\frac{2 \cdot I_{04}}{\beta_4}} - V_{T4} \right)$$

$$= c\Delta V + d \ (c, d: \text{constant}) \quad (30\text{-}c)$$

$$c = \frac{1}{R_0}, d = I_{01} - I_{02} - I_{03} + I_{04} + \frac{b}{R_0} \quad (30\text{-}d)$$

In the case where the circuit elements located at the symmetric positions on the circuit diagram have the same characteristics, the equations (25-a) and (25-b) are established, and gain coefficients $\beta_3$ and $\beta_4$ of $N_3$ and $N_4$ and the threshold voltages $V_{T3}$ and $V_{T4}$ of $N_3$ and $N_4$ become equal to each other. Then, the constant d in the equation (30-c) becomes 0. Therefore, as shown in the equation (32-b), $\Delta I$ becomes proportional to $\Delta V$.

Similarly manner to the prior arts, the mutual conductance $g_m$ and non-linearity E of the shown embodiment of the differential voltage-to-current converter are derived (equations (33-b) and (34-b)). Then, the range of $\Delta V$ and $\Delta I$, in which the satisfactory linearity is established is expressed by the equation (35).

Figure 3:
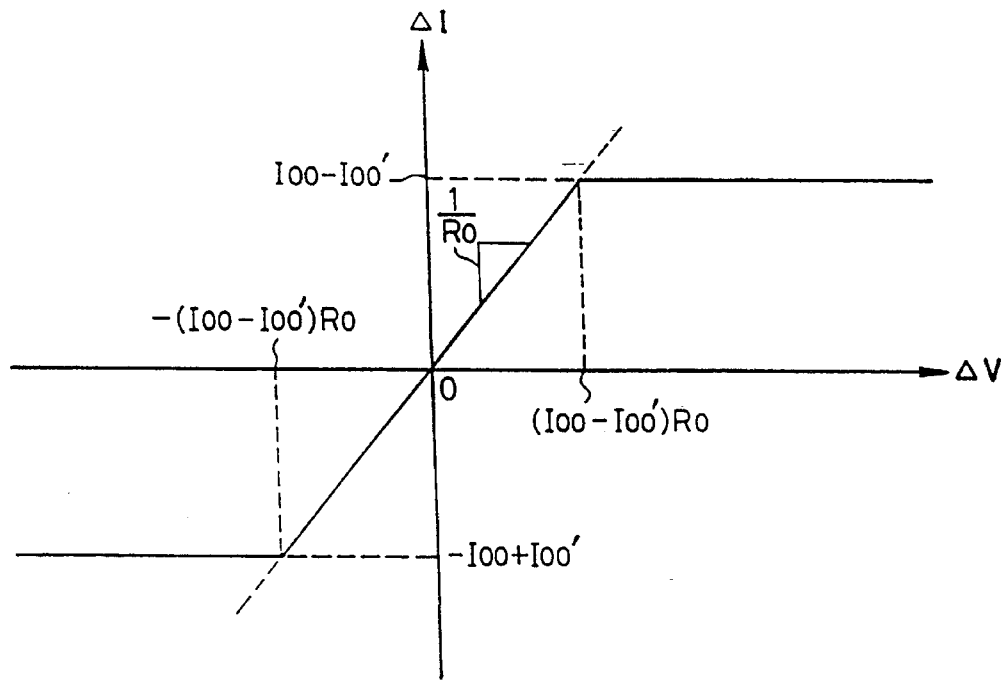
FIG. 3 is an illustration showing an input/output characteristics of the first embodiment of the differential voltage-to-current converter circuit according to the invention.
Figure 4:
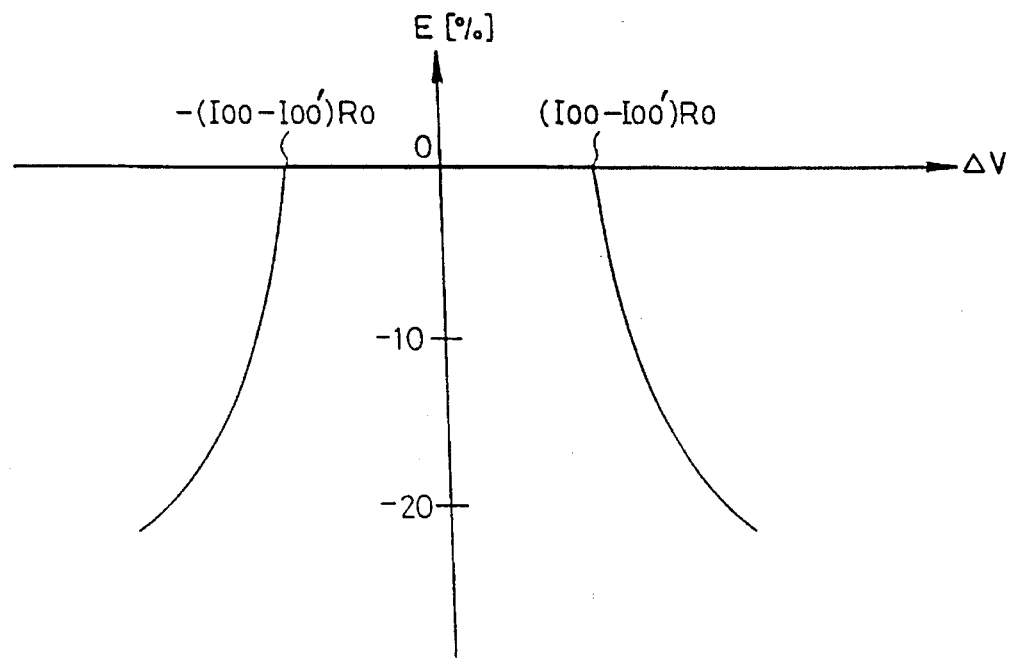
FIG. 4 is an illustration showing a non-linear characteristics of the first embodiment of the differential voltage-to-current converter circuit of the invention.

FIG. 3 shows the input/output characteristics of the shown embodiment of the differential voltage-to-current converter circuit and FIG. 4 shows the characteristics of the non-linearity E in relation to the differential input voltage $\Delta V$.

$$\beta' = \beta_3 = \beta_4 \quad (31\text{-}a)$$
$$\therefore V_{GS3} = V_{GS4} \quad (31\text{-}b)$$
$$b = 0, d = 0 \quad (31\text{-}c)$$
$$\Delta V_R = \Delta V \quad (32\text{-}a)$$

$$\Delta I = \frac{\Delta V}{R_0} \quad (32\text{-}b)$$

$$\frac{1}{g_m} = \frac{1}{g_{max}} \frac{d\Delta V}{d\Delta I} \quad (33\text{-}a)$$

$$= R_0 \quad (33\text{-}b)$$

$$E = \frac{1}{g_{max}} \frac{\Delta I}{\Delta V} - 1 \quad (34\text{-}a)$$

$$= 0 \quad (34\text{-}b)$$

$$(|\Delta I| \le I_{00} - I_{00}'), (|\Delta V| \le R_0 \cdot (I_{00} - I_{00}')) \quad (35)$$

Referring to FIGS. 3 and 4, in the differential voltage-to-current converter circuit in the shown embodiment, even when the differential output current $\Delta I$ is increased according to increasing of the differential input voltage $\Delta V$, the non-linearity E is not increased and to be maintained at 0 within the range defined by the foregoing equation (35).

Next, discussion will be given for the construction and operation of the differential voltage-to-current converter circuit in the case where the circuit shown in FIG. 27 is employed as the first and second signal transmission circuits $A_1$ and $A_2$.

Each of the source terminals of $N_a$ and $N_4$ which are connected to the constant current sources $I_{03}$ and $I_{04}$ at the drain terminals for maintaining the gate-source terminal voltages $V_{GS3}$ and $V_{GS4}$ constant, is connected to the source terminal of each of $N_1$ and $N_2$ as the differential pair so that the voltage between the first input terminal $V_1$ and the source terminal of $N_1$ and the voltage between the second input terminal $V_2$ and the source terminal of $N_2$ are constant.

As shown in FIG. 27, the signal transmission circuit $A_1$ and $A_2$ respectively comprise differential amplifier circuits. To non-inverting inputs of the differential amplifiers $A_1$ and $A_2$, the first and second input terminals $V_1$ and $V_2$ are connected. On the other hand, to the inverting inputs, the drain terminals of $N_3$ and $N_4$ are connected. Outputs of the differential amplifier circuits $A_1$ and $A_2$ are connected to the gate terminals of the first and second NMOSFETs $N_3$ and $N_3$, respectively. The input/output characteristics, mutual conductance and non-linearity of the differential voltage-to-current converter circuit employing the differential amplifiers $A_1$ and $A_2$ as the first and second signal transmission circuits, can be derived in the similar manner to the case of the foregoing embodiment with direct connection.

Discussion will be given hereinafter with respect to the operation of the differential voltage-to-current converter circuit employing the differential amplifier circuits $A_1$ and $A_2$. When the voltage $V_1$ at the first input terminal is risen (the voltage $V_2$ of the second input terminal drops), the drain voltage of $N_3$ is lowered (the drain voltage of $N_4$ is risen). Then, the output of the differential amplifier circuit $A_1$ is risen and the output of the differential amplifier circuit $A_2$ is lowered. These outputs are applied to respective gate terminals of $N_1$ and $N_2$ of the differential pair. Therefore, the drain current of $N_1$ is increased and the drain current of $N_2$ is decreased. Then, the difference of the drain currents of $N_1$ and $N_2$ flows through the source resistor $2R_0$.

Accordingly, the differential amplifier circuits $A_1$ and $A_2$ operate to maintain the gate-source terminal voltages $V_{GS3}$ and $V_{GS4}$ of $N_3$ and $N_4$. Namely, they compensate following up of the source terminals of $N_3$ and $N_4$ to the first and second input terminals and whereby stabilize the operation of the differential voltage-to-current converter circuit. If the amplification factors of the differential amplifier circuits $A_1$ and $A_2$ are sufficiently high, $V_{GS3}$ and $V_{GS4}$ can be maintained constant. Then, the mutual conductance $g_m$ and the non-linearity E can be expressed by the equations (33-b) and (34-b).

Next, discussion will be given for the operation in the case where the differential amplifier circuits of FIG. 27 are employed as the signal transmission circuits $A_1$ and $A_2$ of the differential voltage-to-current converter circuit shown in FIG. 2. As shown in FIG. 27, non-inverting inputs of the differential amplifier circuits $A_1$ and $A_2$ are connected to first and second input terminals $V_1$ and $V_2$, respectively. On the other hand, the inverting inputs are connected to the drain terminals of $N_3$ and $N_4$. The outputs of the differential amplifier circuits $A_1$ and $A_2$ are connected to gate terminals of first and second PMOSFETs $P_1$ and $P_2$.

When the voltage $V_1$ at the first input terminal is risen (the voltage $V_2$ of the second input terminal drops), the drain voltage of $N_3$ is lowered (the drain voltage of $N_4$ is risen). Then, the output of the differential amplifier circuit $A_1$ is risen and the output of the differential amplifier circuit $A_2$ is lowered. These outputs are applied to respective gate terminals of $P_1$ and $P_2$ of the differential pair. Therefore, the drain current of $P_1$ is decreased and the drain current of $P_2$ is increased. Then, the difference of the drain currents of $P_1$ and $P_2$ flows through the source resistor $2R_0$. The differential amplifier circuits $A_1$ and $A_2$ operate to maintain the gate-source terminal voltages $V_{GS3}$ and $V_{GS4}$ of $N_3$ and $N_4$. Namely, they compensate following up of the source terminals of $N_3$ and $N_4$ to the first and second input terminals and whereby stabilize the operation of the differential voltageto-current converter circuit. If the amplification factors of the differential amplifier circuits $A_1$ and $A_2$ are sufficiently high, $V_{GS3}$ and $V_{GS4}$ can be maintained constant. Then, the mutual conductance $g_m$ and the non-linearity can be expressed by the equations (33-b) and (34-b).

In this embodiment, the input/output characteristics and the non-linearity of the differential voltage-to-current converter circuit may be derived in the similar manner even when the inputs of the first and second signal transmission circuits $A_1$ and $A_2$ are first and second input terminals.

On the other hand, in the shown embodiment, it is possible to similarly handle the circuit even when the NMOSFET is replaced with the PMOSFET, PMOSFET is replaced with NMOSFET, and the direction of the constant current source is reversed.

FIGS. 5–8 show the circuit construction, input/output characteristics of the second embodiment of the MOS differential voltage-to-current converter circuit according to the present invention.

Figure 5:
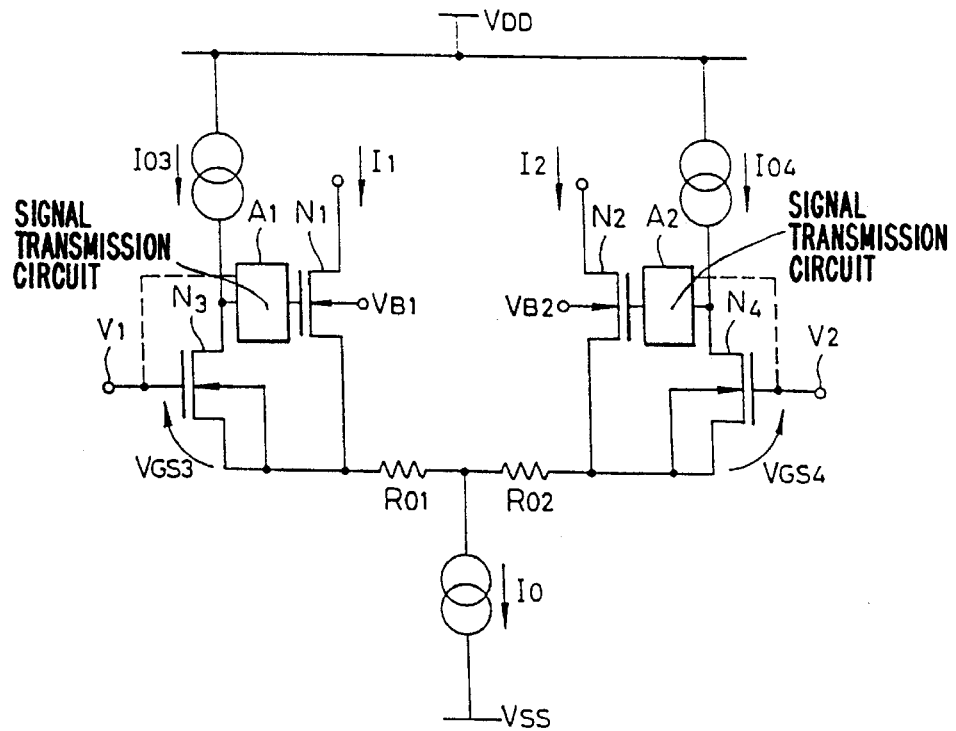
FIG. 5 is an illustration showing a circuit construction of the second embodiment of a sink type differential voltage-to-current converter circuit according to the present invention.
Figure 6:
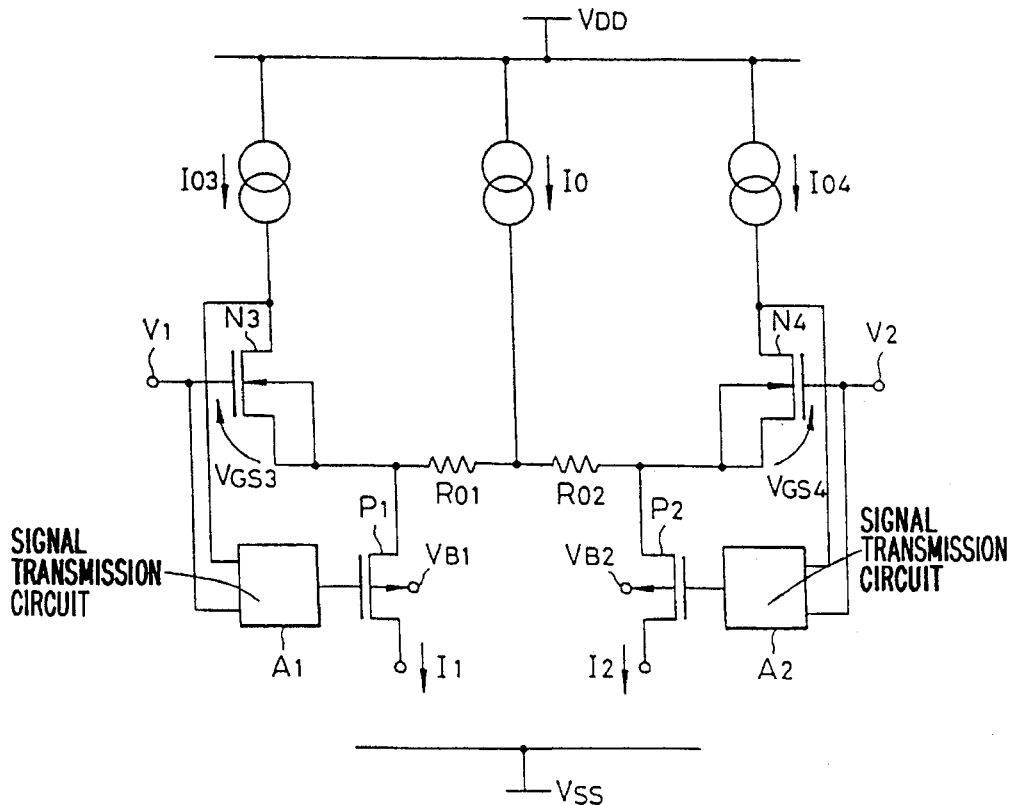
FIG. 6 is an illustration showing a circuit construction of the second embodiment of a source type differential voltage-to-current converter circuit according to the present invention.

As shown in FIGS. 5 and 6, respective source terminals of first and second MOSFETs ($N_1$ and $N_2$ or $P_1$ and $P_2$) forming a differential pair in this embodiment are connected to one terminals of first and second resistors $R_{01}$ and $R_{02}$. The other terminals of the first and second source resistors $R_{01}$ and $R_{02}$ are commonly connected. To the junction of common connection of the first and second resistors $R_{01}$ and $R_{02}$ is connected to a constant current source $I_0$.

Figure 16:
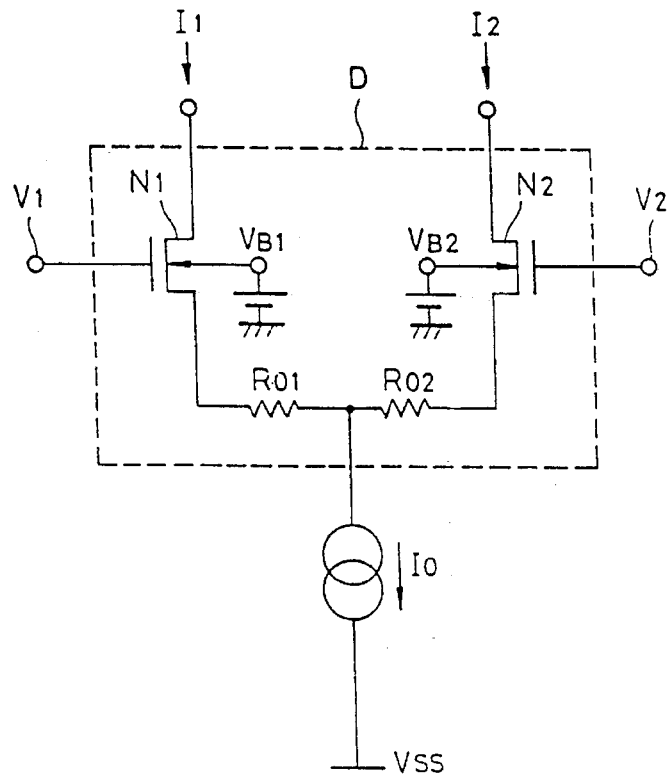
FIG. 16 is an illustration showing the circuit construction of the second prior art.
Figure 17:
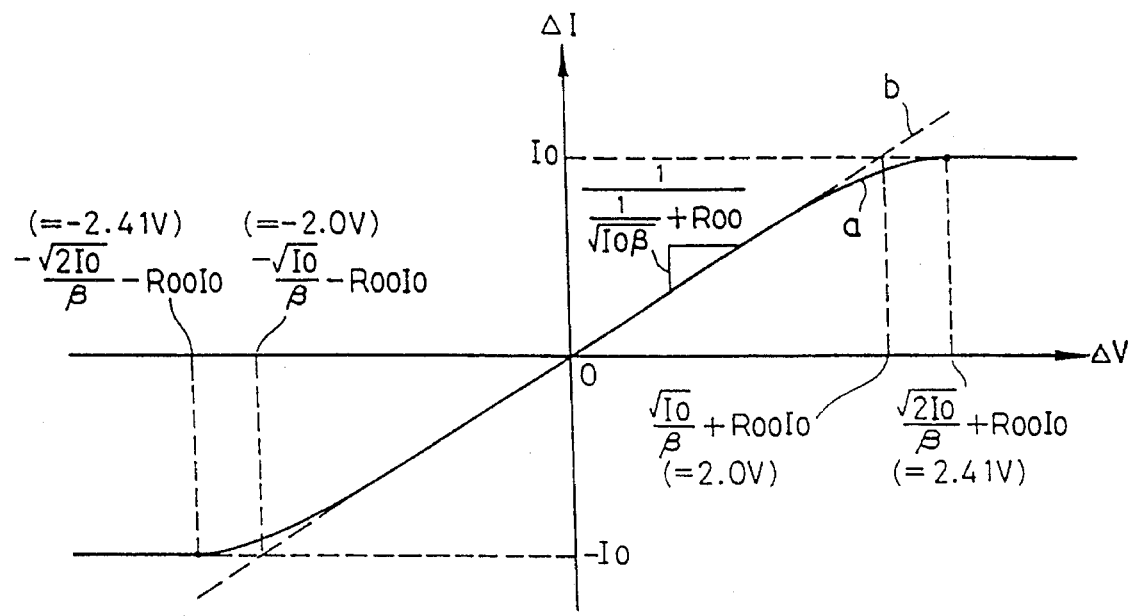
FIG. 17 is an illustration showing the input/output characteristics of the second prior art.
Figure 18:
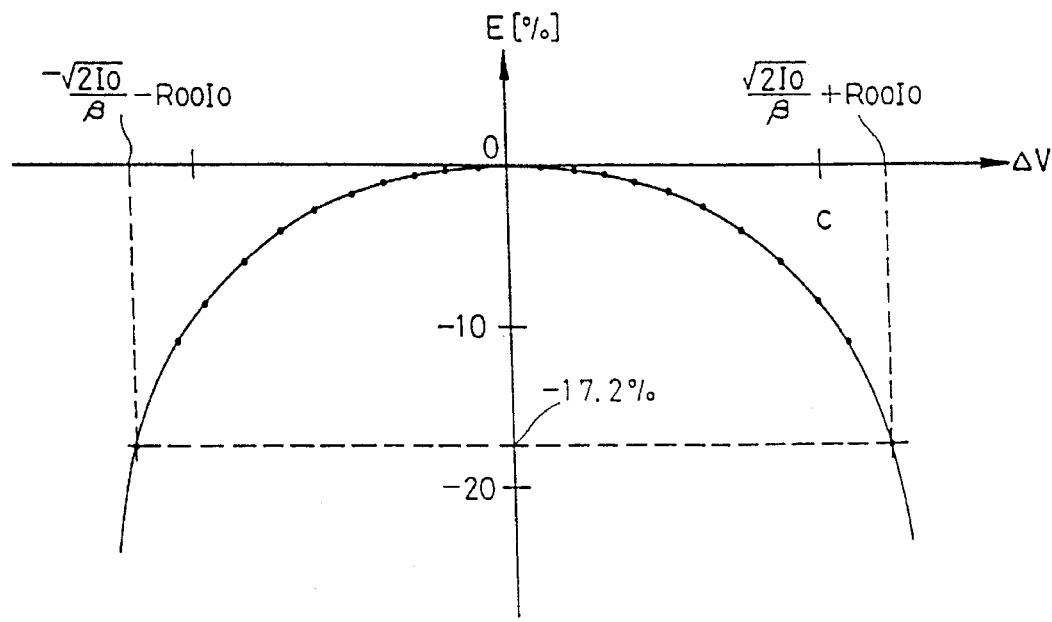
FIG. 18 is an illustration showing the non-linearity of the second prior art.
Figure 19:
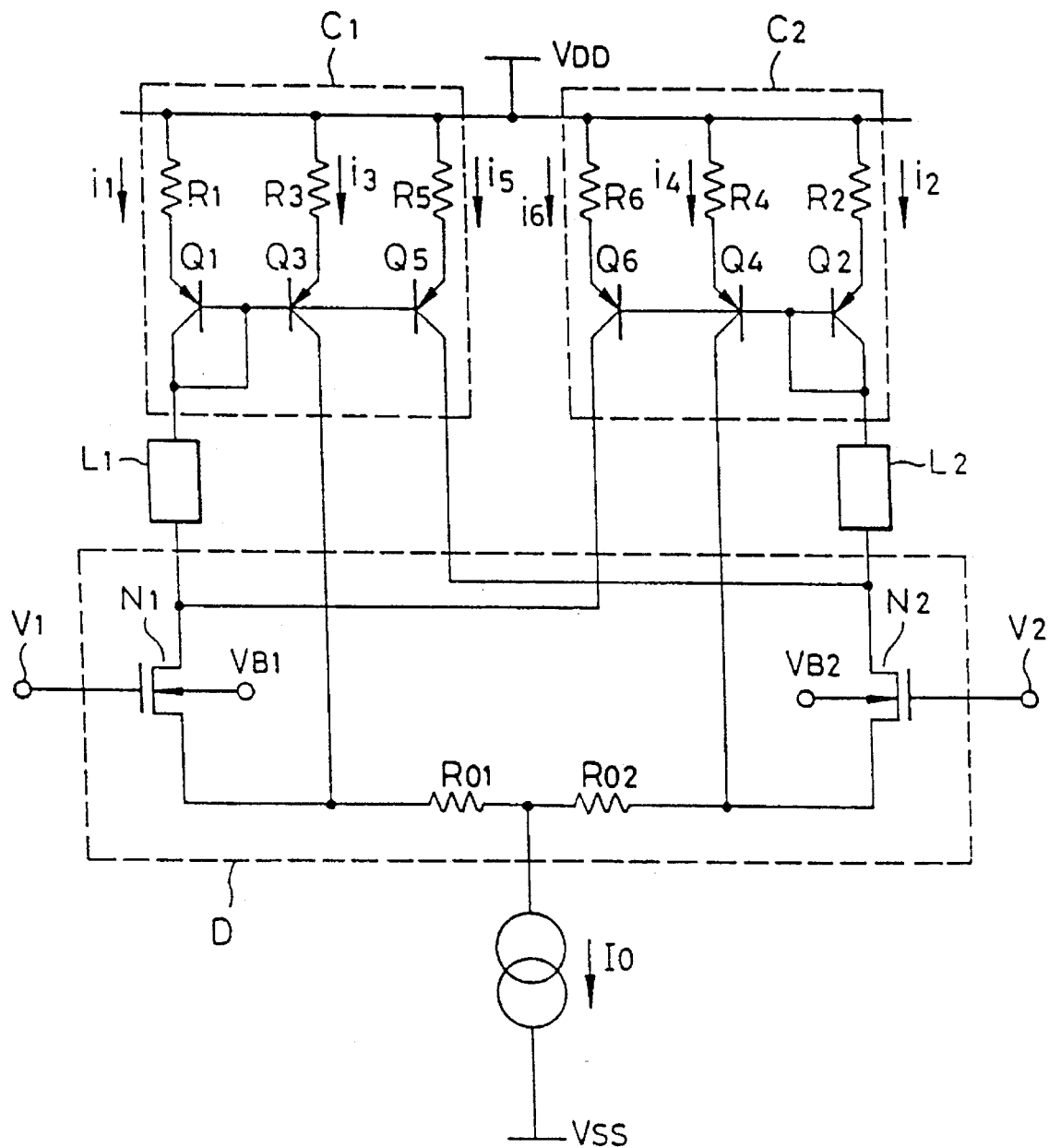
FIG. 19 is an illustration showing the circuit construction of the third prior art.
Figure 20:
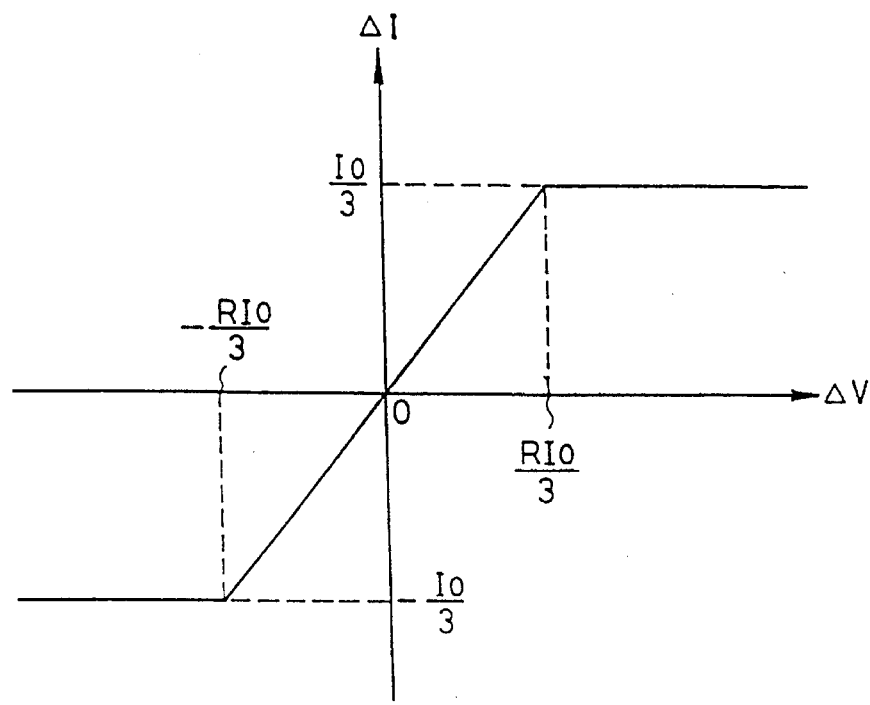
FIG. 20 is an illustration showing the input/output characteristics of the third prior art.
Figure 21:
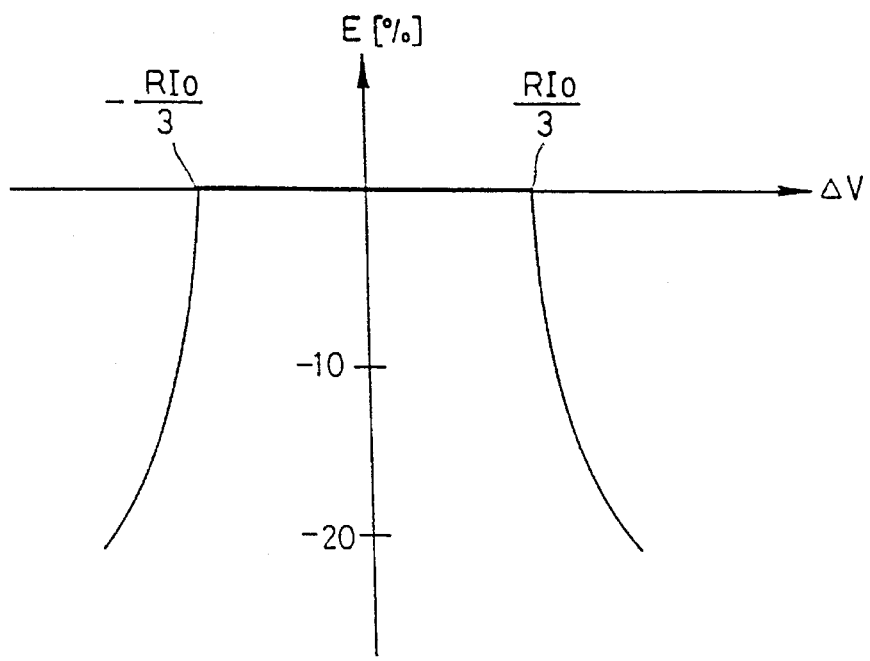
Figure 22:
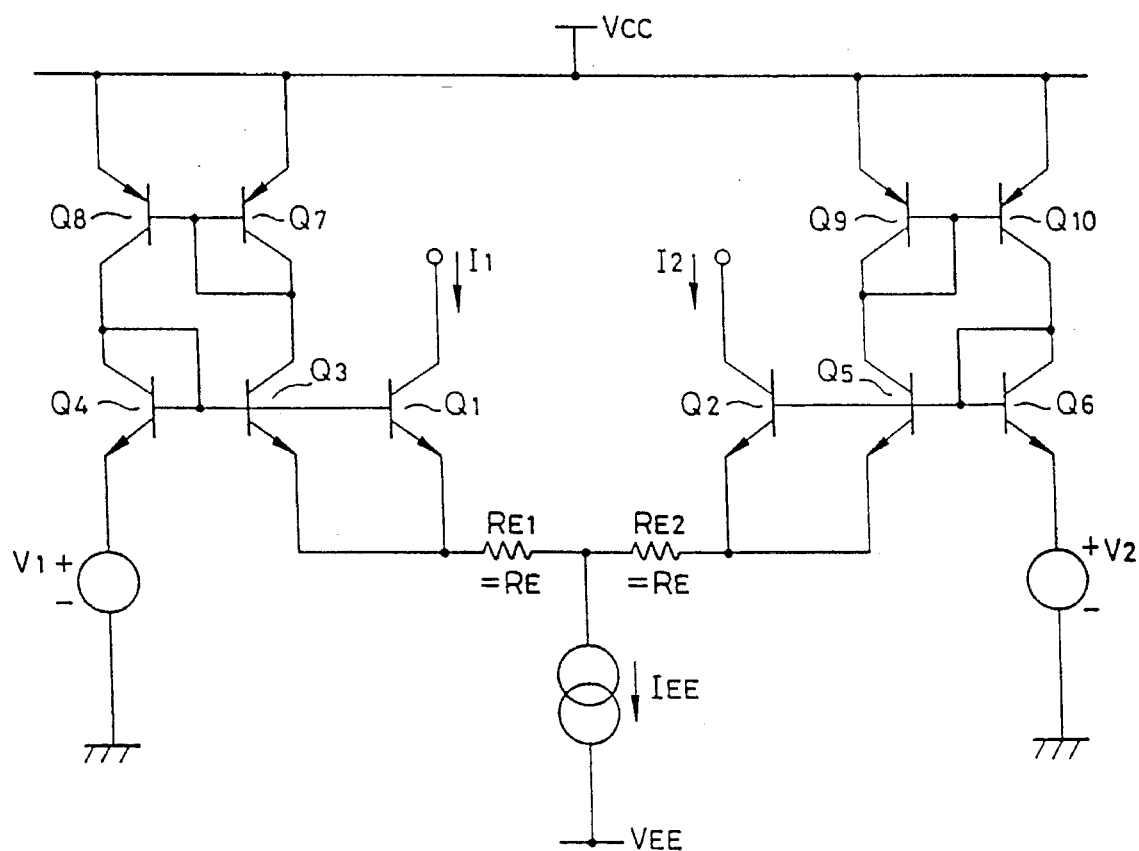
FIG. 22 is an illustration showing the circuit construction of the fourth prior art.
Figure 23:
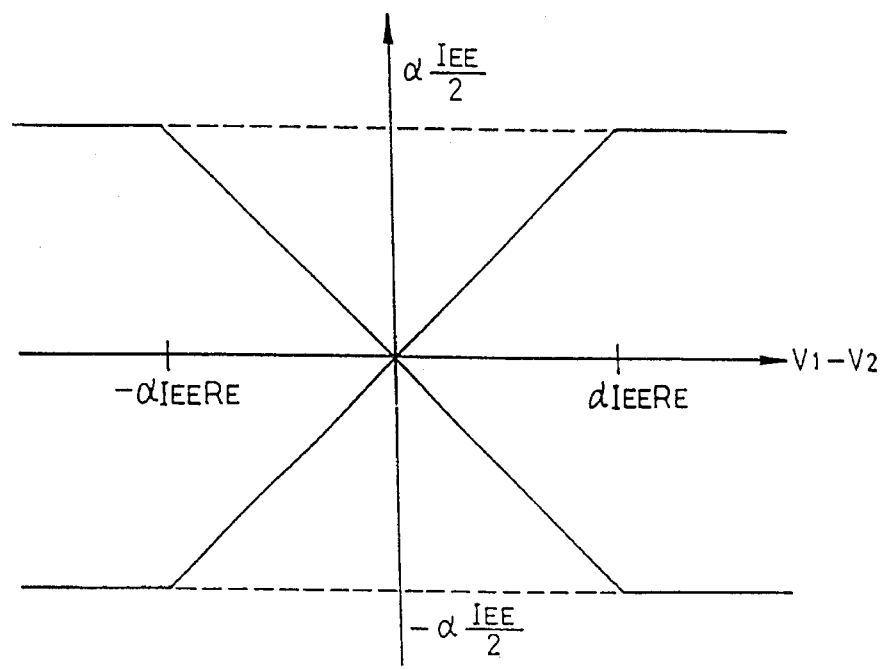
FIG. 23 is an illustration showing the input/output characteristics of the fourth prior art.
Figure 24:
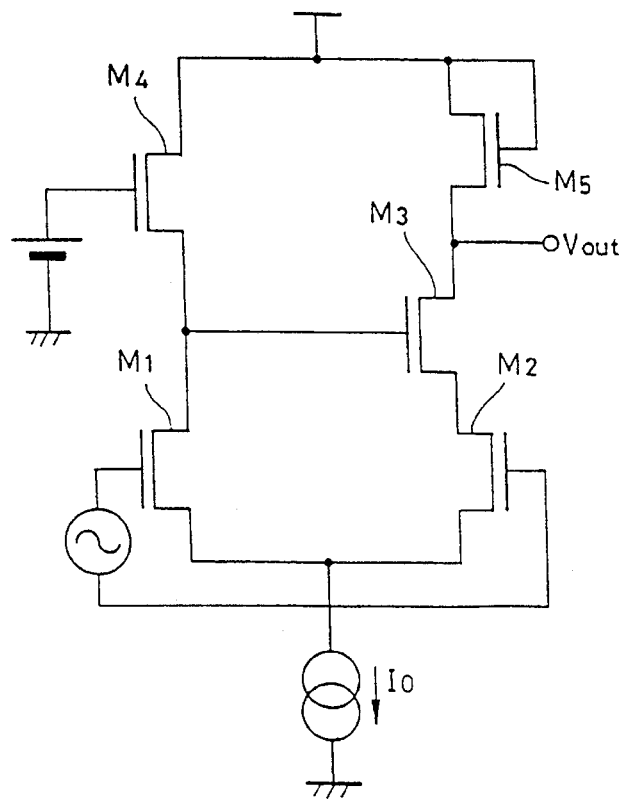
FIG. 24 is an illustration showing the circuit construction of the fifth prior art.
Figure 25:
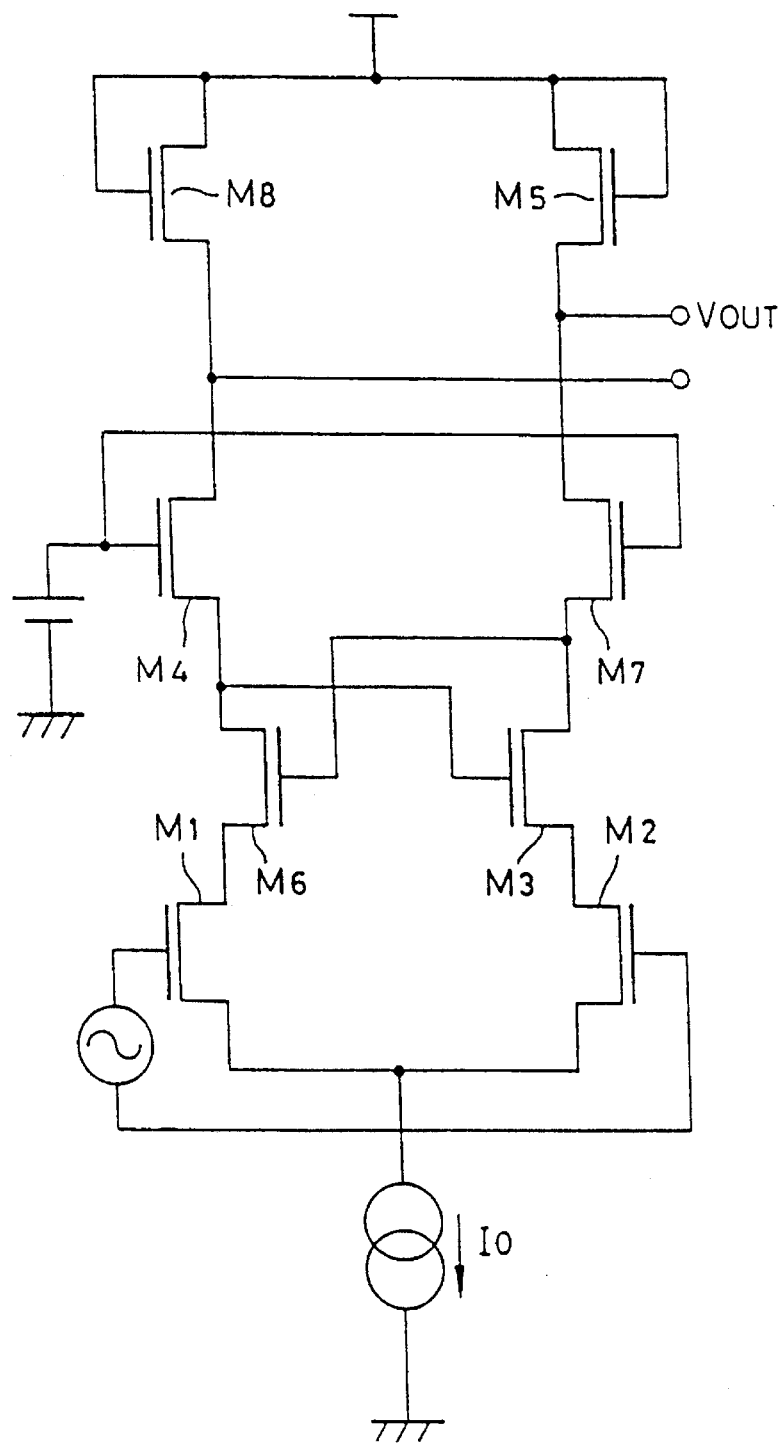
FIG. 25 is an illustration showing circuit construction of another example of the fifth prior art.

FIG. 5 shows the circuit construction of a sink type MOS differential voltage-to-current converter circuit and FIG. 6 shows the circuit construction of a source type MOS differential voltage-to-current converter circuit. In FIG. 5, the functionally common elements to those in FIG. 16 which illustrates the second prior art will be represented by the same reference numerals. In FIG. 5, $N_3$ and $N_4$ are third and fourth NMOSFETs, and $V_{S3}$ and $V_{S4}$ are backgate terminals and voltages.

As the signal transmission circuits $A_1$ and $A_2$ in the shown embodiment, circuit constructions illustrated in FIGS. 26 and 27 can be employed On the other hand, as the signal transmission circuits $A_1$ and $A_2$ in FIG. 6, the circuit illustrated in FIG. 27 may be employed. As the constant current sources of FIGS. 5 and 6, various current-mirror circuits illustrated in FIGS. 30 to 33 may be employed.

Hereinafter, the construction and operation of the MOS differential voltage-to-current converter circuit constructed by employing direct connection of FIG. 26 in the first and second signal transmission circuits $A_1$ and $A_2$ in FIG. 5.

As shown in FIG. 5, the constant current sources $I_{03}$ and $I_{04}$ are connected to the drain terminals of MOSFET $N_3$ and $N_4$, respectively for maintaining the gate-source terminal voltages $V_{GS3}$ and $V_{GS4}$ of $N_3$ and $N_4$ constant. The source terminals of $N_3$ and $N_4$ are respectively connected to the source terminals of $N_1$ and $N_2$ to maintain the voltage between the first input terminal $V_1$ and the source terminal of $N_1$ and the voltage between the second input terminal $V_2$ and the source terminal of $N_2$ constant. The drain terminals of $N_3$ and $N_4$ are respectively connected to the gate terminals of $N_1$ and $N_2$.

It should be noted that the following condition is established with respect to the constant current sources $I_0$, $I_{03}$ and $I_{04}$.

$$|I_{03}|+|I_{04}| \leq |I_0|$$

Under the condition set forth above, the operation of the differential voltage-to-current converter circuit of FIG. 5 will be discussed hereinafter. The voltage at opposite ends of the first and second resistors $R_{01}$ and $R_{02}$ are expressed by $\Delta V_R$. Then, in the loop of $V_1 \sim V_{GS3} \sim \Delta V_R \sim V_{GS4} \sim V_2$, the equation (38-a) can be established from Kirchhoff's law. Substituting the equation (27) with $V_{GS3}$ and $V_{GS4}$ of the equation (38-a), the equation (38-b) can be established. Term in the parenthesis of the equation (38-b), becomes independent of the differential input voltage $\Delta V$. Expressing the term in the parenthesis as $-b$, $\Delta V_R$ can be expressed with a linear equation (equation (38-c)).

Assuming the current of the first and second resistors $R_{01}$ and $R_{02}$ of FIG. 5 are $I_{R01}$ and $I_{R02}$, and the equation (39) is established on the basis of Kirchhoff's law with respect to the common junction, the voltage $\Delta V_R$ at opposite ends of the resistors $R_{01}$ and $R_{02}$ is expressed by the equation (40), From the equations (39) and (40), the currents $I_{R01}$ and $I_{R02}$ can be expressed by the equation (41). From the equation (39) based on Kirchhoff's law, the differential output current $\Delta I$ is expressed by the equation (42-a). By substituting the equation (42-a) with $I_{R01}$ and $I_{R02}$ of the equation (41), the equation (42-b) can be established. By substituting $\Delta V_R$ of the equation (42-b) with the equation (38-b), the equation (42-c) is established. Thus, a linear relational expression of the differential output current $\Delta I$ and the differential input voltage $\Delta V$ can be derived (equation (42-d). It should be noted that constants c and d are defined by equations (42-e) and (42-f).

Figure 7:
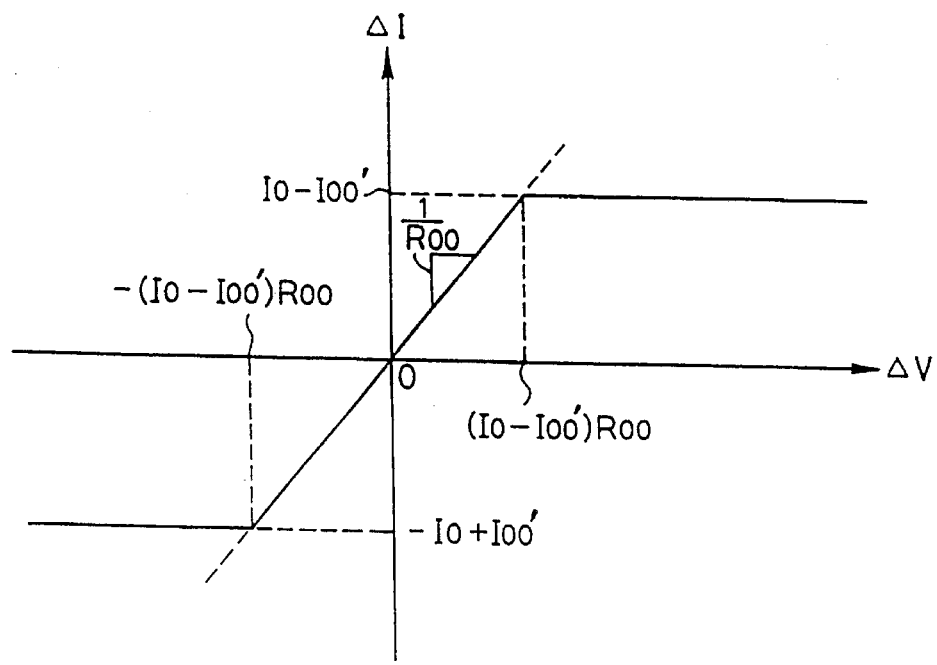
FIG. 7 is an illustration showing an input/output characteristics of the second embodiment of the differential voltage-to-current converter circuit according to the invention.

In the case where circuit elements arranged at symmetrical positions have the same characteristics, the equations (36-a), (36-b) and (43) are established. Then, the constant b becomes 0. Therefore, $\Delta V_R$ becomes equal to $\Delta V$, and $\Delta I$ becomes proportional to $\Delta V$ (equations (45-a) and (45-b)). FIG. 7 shows the input/output characteristics of the shown embodiment.

$$R_{00} = R_{01} = R_{02} \tag{36-a}$$

$$\Delta I_{00}' = 2 \cdot I_{03} = 2 \cdot I_{04} \tag{36-b}$$

$$\Delta V = V_1 - V_2 \tag{37}$$

$$\Delta V_R = V_1 - V_{GS3} - V_2 + V_{GS4} \tag{38-a}$$

$$= V_1 - V_2 - \left( \sqrt{\frac{2 \cdot I_{03}}{\beta_3}} + V_{T3} - \sqrt{\frac{2 \cdot I_{04}}{\beta_3}} - V_{T4} \right) \tag{38-b}$$

$$= \Delta V + b \ (b: \text{constant}) \tag{38-c}$$

$$b = \left( \sqrt{\frac{2 \cdot I_{03}}{\beta_3}} + V_{T3} - \sqrt{\frac{2 \cdot I_{04}}{\beta_4}} - V_{T4} \right) \tag{38-d}$$

$$I_0 = I_{R01} + I_{R02}, \ I_{R01} = I_1 + I_{03}, \ I_{R02} = I_2 + I_{04} \tag{39}$$

$$R_{01} I_{R01} - R_{02} I_{R02} = \Delta V_R \tag{40}$$

$$I_{R01} = \frac{\Delta V_R + R_{02} I_0}{R_{01} + R_{02}}, \ I_{R02} = \frac{R_{01} I_0 - \Delta V_R}{R_{01} + R_{02}} \tag{41}$$

$$\Delta I = I_1 - I_2$$

$$= I_{R01} - I_{R02} - I_{03} + I_{04} \tag{42-a}$$

$$= \frac{R_{01} - R_{02}}{R_{01} + R_{02}} I_0 - I_{03} + I_{04} + \frac{2 \Delta V_R}{R_{01} + R_{02}} \tag{42-b}$$

$$= \frac{R_{01} - R_{02}}{R_{01} + R_{02}} I_0 - I_{03} + I_{04} + \frac{2 \Delta V}{R_{01} + R_{02}} - \tag{42-c}$$

$$\frac{2}{R_0 + R_1} - \left( \sqrt{\frac{2 \cdot I_{04}}{\beta_4}} + V_{T3} - \sqrt{\frac{2 \cdot I_{03}}{\beta_3}} - V_{T4} \right)$$

$$= c \Delta V + d \ (c, d: \text{constant}) \tag{42-d}$$

-continued $$c = \frac{2}{R_{01} + R_{02}} \quad (42\text{-e})$$

$$d = \frac{R_{01} - R_{02}}{R_{01} + R_{02}} I_0 - I_{03} + I_{04} + \frac{2b}{R_{01} + R_{02}} \quad (42\text{-f})$$

Figure 8:
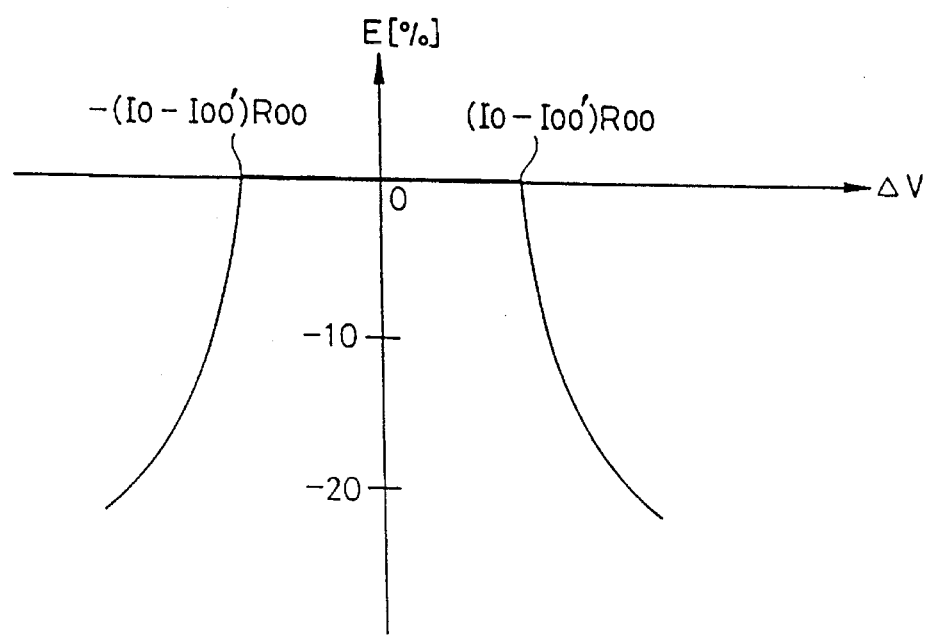
FIG. 8 is an illustration showing a non-linear characteristics of the second embodiment of the differential voltage-to-current converter circuit of the invention.

The mutual conductance $g_m$, non-linearity E and the range to be established are defined by the equations (46) to (48). The characteristic curve of the non-linearity E is illustrated in FIG. 8.

$$\beta' = \beta_3 - \beta_4 \quad (43)$$

$$V_{GS3} = V_{GS4} \quad (44\text{-a})$$

$$b = 0, \quad d = 0 \quad (44\text{-b})$$

$$\Delta V_R = \Delta V \quad (45\text{-a})$$

$$\Delta I = \frac{\Delta V}{R_{00}} \quad (45\text{-b})$$

$$\frac{1}{g_m} = \frac{1}{g_{mmax}} \frac{d\Delta V}{d\Delta I} \quad (46\text{-a})$$

$$= R_{00} \quad (46\text{-b})$$

$$E = \frac{1}{g_{mmax}} \frac{\Delta I}{\Delta V} - 1 \quad (47\text{-a})$$

$$= 0 \quad (47\text{-b})$$

$$(|\Delta I| \leq I_{00} - I_{00}'), (|\Delta V| \leq R_{00} \cdot (I_{00} - I_{00}')) \quad (48)$$

From the equation (47-b) and FIGS. 7 and 8, it should be appreciated that even when the differential output current $\Delta I$ is increased according to increasing of the differential input voltage $\Delta V$, the non-linearity E is not increased, and maintained 0 within the range defined by the equation (48).

In the shown embodiment, it is possible to similarly handle the circuit even when the NMOSFET is replaced with the PMOSFET, PMOSFET is replaced with NMOSFET, and the direction of the constant current source is reversed.

Next, discussion will be given for the operation in the case where the differential amplifier circuits of FIG. 27 are employed as the signal transmission circuits $A_1$ and $A_2$ of the shown embodiment of the differential voltage-to-current converter circuit. The non-inverting inputs of the differential amplifier circuits $A_1$ and $A_2$ are connected to first and second input terminals $V_1$ and $V_2$, respectively. On the other hand, the inverting inputs are connected to the drain terminals of $N_3$ and $N_4$. The outputs of the differential amplifier circuits $A_1$ and $A_2$ are connected to gate terminals of first and second NMOSFETs $N_1$ and $N_2$.

The input/output characteristics and the non-linearity E can be derived in the similar manner to the foregoing first embodiment. Also, the operation is as set forth above, the differential amplifier circuits $A_1$ and $A_2$ operate to maintain the gate-source terminal voltages $V_{GS3}$ and $V_{GS4}$ of $N_3$ and $N_4$. Namely, they compensate following up of the source terminals of $N_3$ and $N_4$ to the first and second input terminals and whereby stabilize the operation of the differential voltage-to-current converter circuit. The mutual conductance $g_m$ and the non-linearity E are defined by the equations (46-b) and (47-b).

In the case where the differential amplifier circuits of FIG. 27 are employed as the signal transmission circuits $A_1$ and $A_2$ of the differential voltage-to-current converter circuit of FIG. 6, the non-inverting inputs of the differential amplifier circuits $A_1$ and $A_2$ are connected to first and second input terminals $V_1$ and $V_2$, respectively. On the other hand, the inverting inputs are connected to the drain terminals of $N_3$ and $N_4$. The outputs of the differential amplifier circuits $A_1$ and $A_2$ are connected to gate terminals of first and second PMOSFETs $P_1$ and $P_2$. The input/output characteristics and the non-linearity E of the differential voltage-to-current converter circuit constructed as set forth above can be derived in the similar manner to the foregoing first embodiment. The differential amplifier circuits $A_1$ and $A_2$ operate to maintain the gate-source terminal voltages $V_{GS3}$ and $V_{GS4}$ of $N_3$ and $N_4$. Namely, they compensate following up of the source terminals of $N_3$ and $N_4$ to the first and second input terminals and whereby stabilize the operation of the differential voltage-to-current converter circuit. The mutual conductance $g_m$ and the non-linearity E are defined by the equations (46-b) and (47-b).

Figure 9:
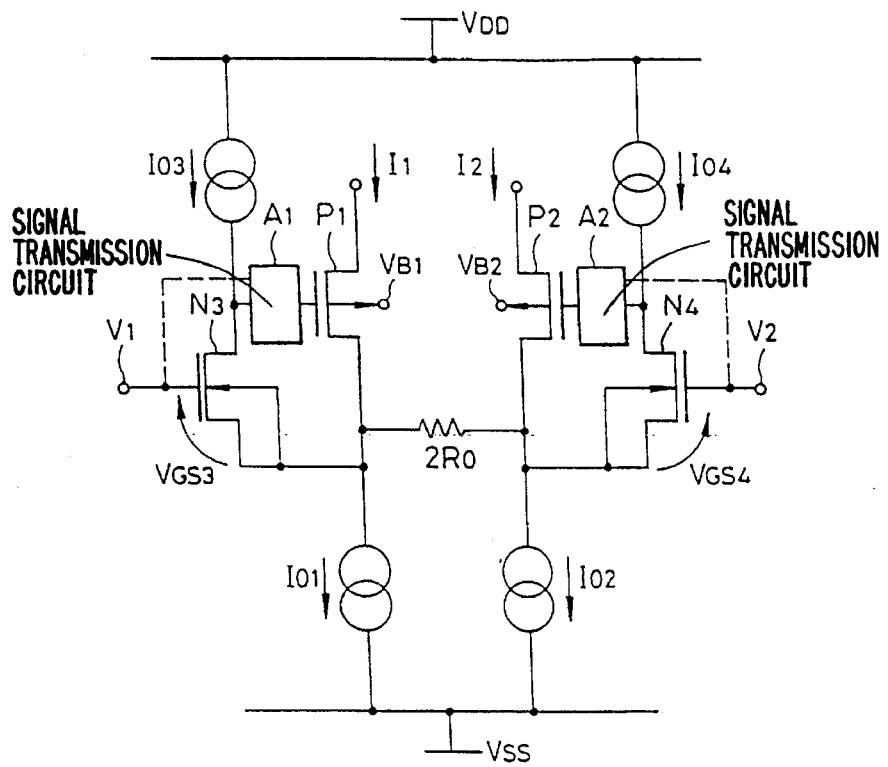
FIG. 9 is an illustration showing a circuit construction of the third embodiment of a sink type differential voltage-to-current converter circuit according to the present invention.
Figure 10:
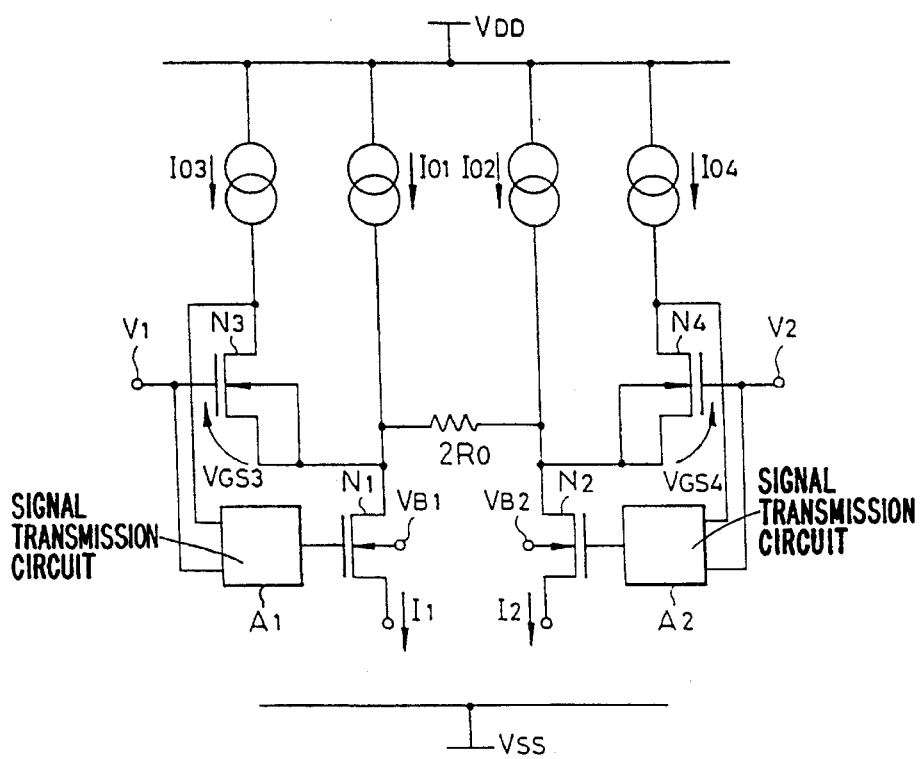
FIG. 10 is an illustration showing a circuit construction of the third embodiment of a source type differential voltage-to-current converter circuit according to the present invention.

FIGS. 9 and 10 shows the third embodiment of the differential voltage-to-current converter circuit of the present invention. FIG. 9 shows the differential is voltage-to-current circuit which is constructed by replacing NMOSFETs $N_1$ and $N_2$ in the differential voltage-to-current converter circuit of FIG. 1 with PMOSFETs $P_1$ and $P_2$. Also, FIG. 10 shows the embodiment, in which the PMOSFETs $P_1$ and $P_2$ of FIG. 2 with NMOSFETs $N_1$ and $N_2$. The resistor $2R_0$ is connected between the drain terminals of $P_1$ and $P_2$ or $N_1$ and $N_2$ of the differential pair, In FIGS. 9 and 10, like circuit elements to those of FIGS. 1 and 2 will be represented by the same reference numerals.

FIG. 9 shows the circuit construction of a sink type MOS differential voltage-to-current converter circuit and FIG. 10 shows the circuit construction of a source type MOS differential voltage-to-current converter circuit.

Figure 28:
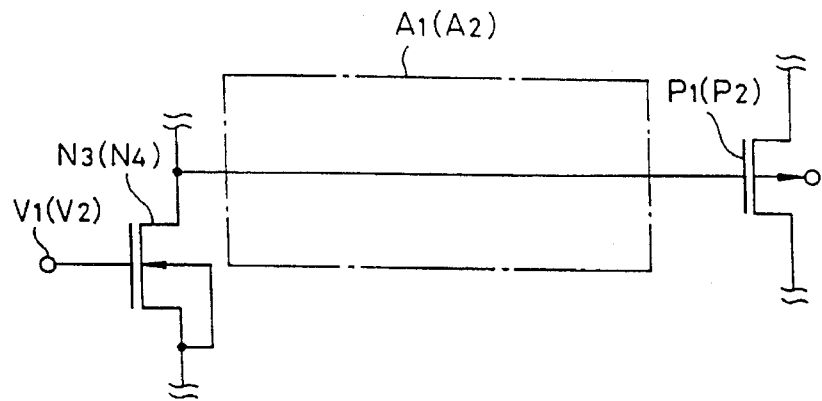
FIG. 28 is an illustration showing one embodiment of a signal transmission circuit to be employed in the third and fourth embodiment of the invention.
Figure 29:
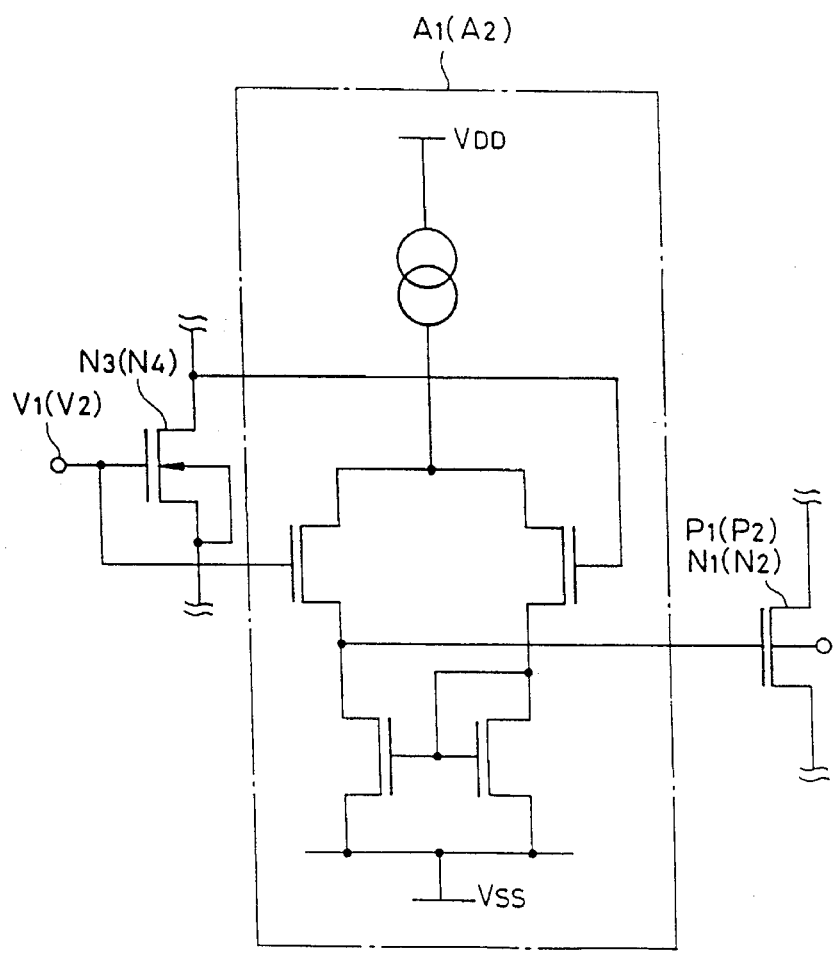
FIG. 29 is an illustration showing another embodiment of a signal transmission circuit to be employed in the third and fourth embodiment of the invention.
Figure 30:
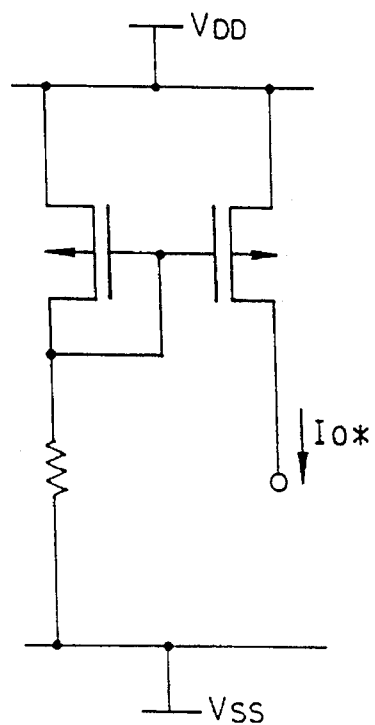
FIG. 30 is an illustration showing first embodiment of a constant current source to be employed in the first to fourth embodiments of the invention.
Figure 31:
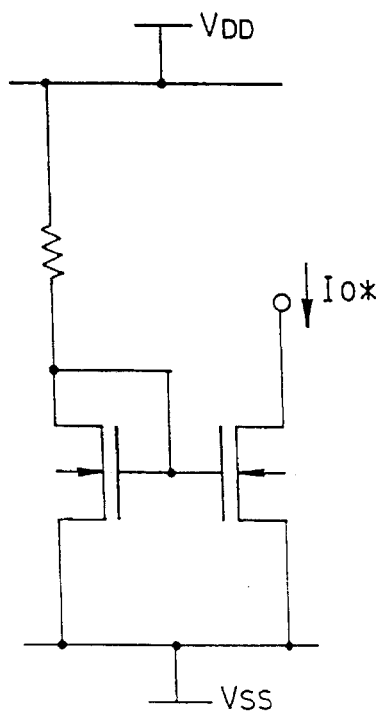
FIG. 31 is an illustration showing second embodiment of a constant current source to be employed in the first to fourth embodiments of the invention.
Figure 32:
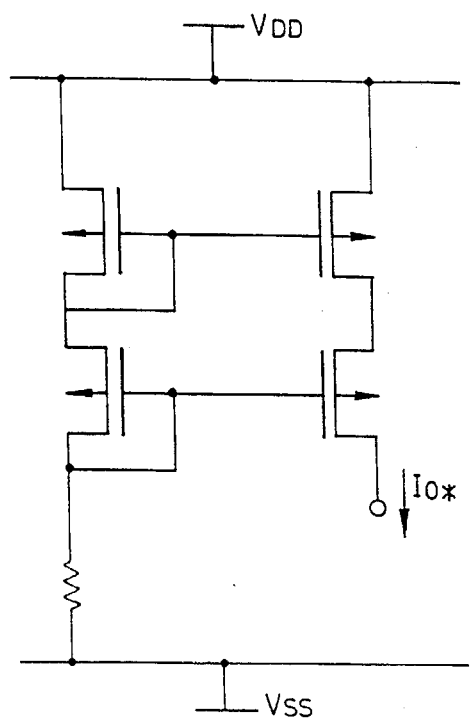
FIG. 32 is an illustration showing third embodiment of a constant current source to be employed in the first to fourth embodiments of the invention.
Figure 33:
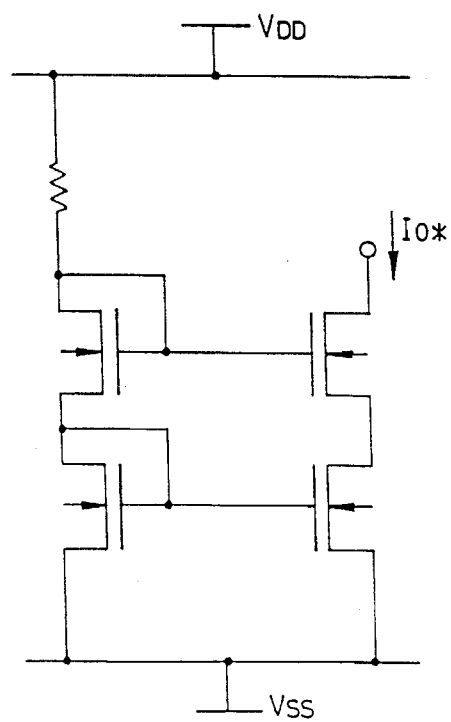
FIG. 33 is an illustration showing fourth embodiment of a constant current source to be employed in the first to fourth embodiments of the invention.

As the signal transmission circuits $A_1$ and $A_2$ in the shown embodiment, circuit constructions illustrated in FIGS. 28 and 29 can be employed On the other hand, as the signal transmission circuits $A_1$ and $A_2$ in FIG. 10, the circuit illustrated in FIG. 28 may be employed. As the constant current source, various current-mirror circuits illustrated in FIGS. 30 to 33 may be employed.

The input/output characteristics and the non-linearity E of the shown embodiment can be derived in the similar manner to the first embodiment. Thus, equivalent characteristics to the first embodiment can be obtained.

Figure 11:
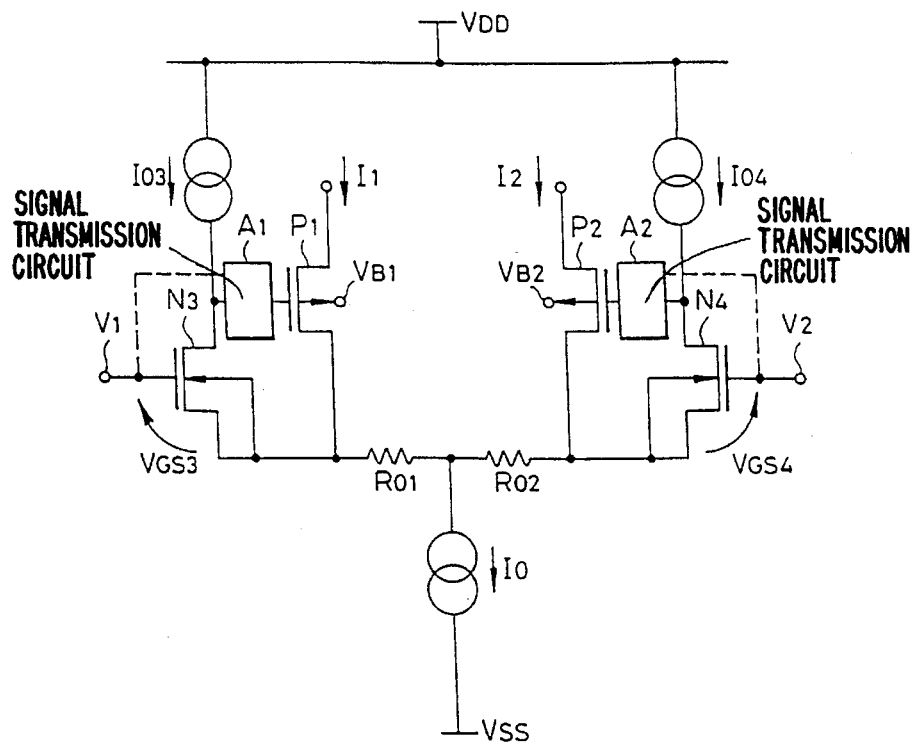
FIG. 11 is an illustration showing a circuit construction of the fourth embodiment of a sink type differential voltage-to-current converter circuit according to the present invention.
Figure 12:
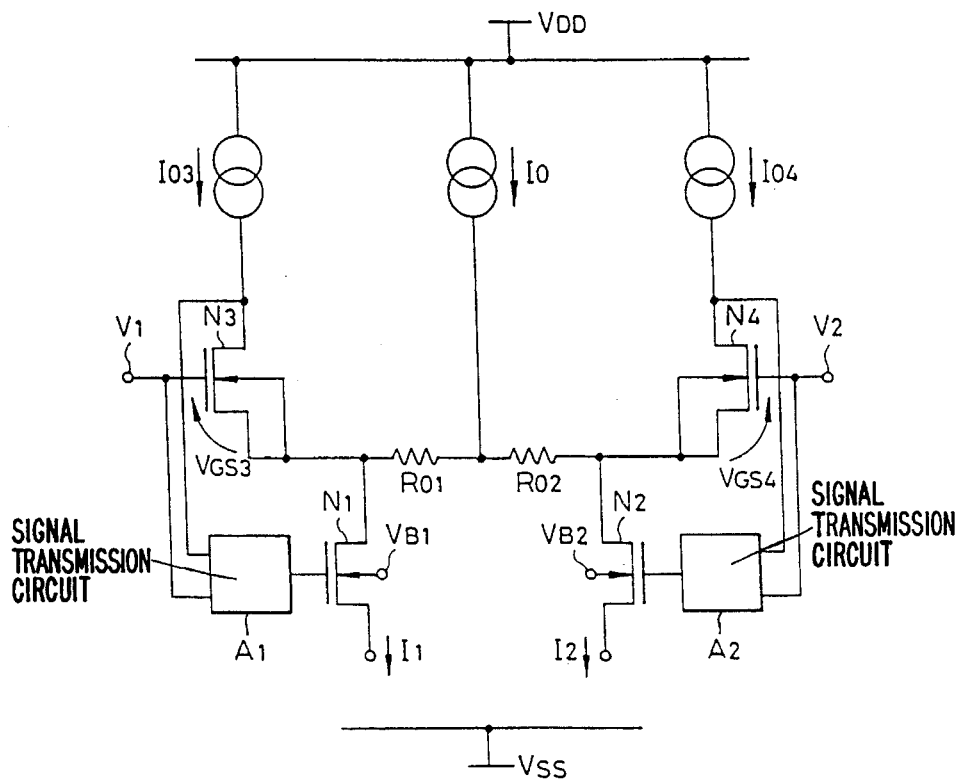
FIG. 12 is an illustration showing a circuit construction of the fourth embodiment of a source type differential voltage-to-current converter circuit according to the present invention.

FIGS. 11 and 12 shows the third embodiment of the differential voltage-to-current converter circuit of the present invention. FIG. 9 shows the differential voltage-to-current circuit which is constructed by replacing NMOSFETs $N_1$ and $N_2$ in the differential voltage-to-current converter circuit of FIG. 1 with PMOSFETs $P_1$ and $P_2$. Also, FIG. 10 shows the embodiment, in which the PMOSFETs $P_1$ and $P_2$ of FIG. 2 with NMOSFETs $N_1$ and $N_2$. The first and second resistors $R_{01}$ and $R_{02}$ are connected between the drain terminals of $P_1$ and $P_2$ or $N_1$ and $N_2$ of the differential pair, In FIGS. 11 and 12, like circuit elements to those of FIGS. 5 and 6 will be represented by the same reference numerals.

FIG. 11 shows the circuit construction of a sink type MOS differential voltage-to-current converter circuit and FIG. 12 shows the circuit construction of a source type MOS differential voltage-to-current converter circuit.

As the signal transmission circuits $A_1$ and $A_2$ in the shown embodiment of FIG. 11, circuit constructions illustrated in FIGS. 28 and 29 can be employed On the other hand, as the signal transmission circuits $A_1$ and $A_2$ in FIG. 12, the circuit illustrated in FIG. 29 may be employed. As the constant current source, various current-mirror circuits illustrated in FIGS. 30 to 33 may be employed.

The input/output characteristics and the non-linearity E of the shown embodiment can be derived in the similar manner to the second embodiment. Thus, equivalent characteristics to the first embodiment can be obtained.

Concerning the first to fourth embodiments of the present invention, it is regarded that the constant current $I_0$ connected to the common junction of the first and second resistors and the first and second constant currents $I_{01}$ and $I_{02}$ connected to the source terminals of the first and second MOSFETs are ideal constant currents. Also, it is assumed that respective currents satisfies the following equation, then these embodiments of the differential voltage-to-current converters may show equivalent characteristics.

$$I_0 = 2I_{01} = 2I_{02}, \quad R_0 = R_{01} = R_{02}$$

On the other hand, the first and second signal transmission circuits $A_1$ and $A_2$ in the foregoing first to fourth embodiments of the invention may be constructed by source followers, voltage followers having amplification factor being 1 or so forth, in addition to the differential amplifiers and direct connection.

As set forth in the first and second embodiments, in the differential voltage-to-current converter circuit according to the shown embodiments, the linearity of the input/output characteristics can be maintained even when the constant current sources $I_{01}$ to $I_{04}$, MOSFETs $N_1$ to $N_4$ or $P_1$ to $P_4$ and so forth placed at symmetric positions on the circuit diagram do no have the same characteristics. Namely, even when the characteristics of each pair of circuit elements are not the same, the relationship between the differential input voltage $\Delta V$ and the voltage $\Delta V_R$ at opposite ends of source (drain) resistor can be expressed by the general equation $V_R = \Delta V + b$ (b: constant) as expressed in the equations (28-c) and (38-c). Therefore, the relationship between the differential input voltage $\Delta V$ and the differential output current $\Delta I$ can be expressed by the linear equation of $\Delta I = c\Delta V + d$ (c, d: constants) as expressed in the equations (30-c) and (42-c). Therefore, in either case, linearity can be maintained.

Concerning the mutual conductance and the non-linearity E of the shown embodiments of the differential voltage-to-current converter circuits, the relationship expressed by the equations (33-b) and (34-b) or (46-b) and (47-b) within a range defined by the equation (49) or (50).

$$( \Delta I \leq I_{01} + I_{02} - I_{03} - I_{04}) \quad (49)$$

$$( \Delta V \leq R_{00} \cdot (I_{01} + I_{02} - I_{03} - I_{04}))$$

$$( \Delta I \leq I_0 - I_{03} - I_{04}) \quad (50)$$

$$\left( |\Delta V| \leq \frac{R_0 + R_{01}}{2} \cdot (I_0 - I_{03} - I_{04}) \right)$$

FIGS. 34, 35, 36 and 37 show the circuit construction, and input/output characteristics of the fifth embodiment of the differential voltage-to-current converter-circuit according to the present invention.

The shown embodiment (FIGS. 34 and 35) of the differential voltage-to-current converter circuit is constructed by connecting the first and second constant current sources $I_{01}$ and $I_{02}$ to the first and second MOSFETs ($N_1$ and $N_2$ or $P_1$ and $P_2$). One resistor $2R_0$ is connected between the source terminals of the first and second MOSFETs.

Figure 34:
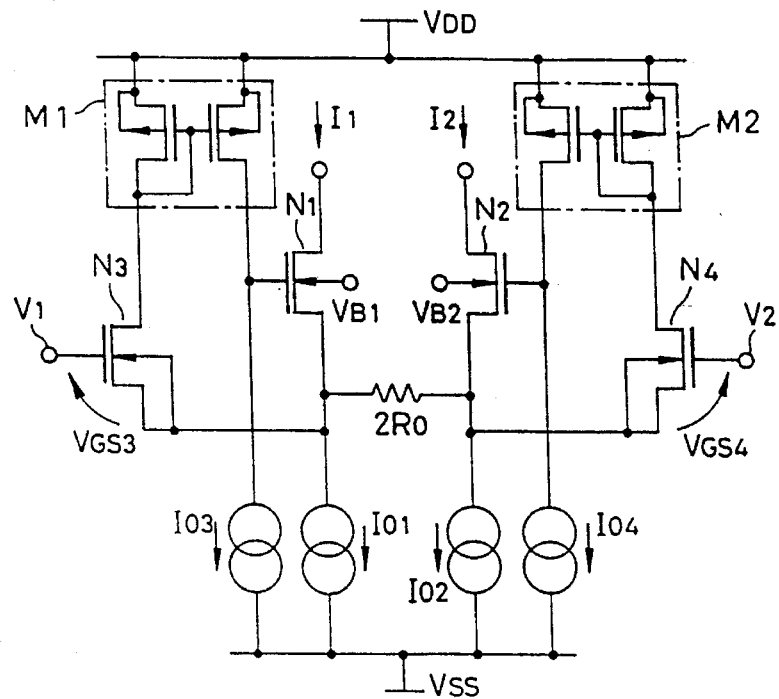
FIG. 34 is an illustration showing a circuit construction of the fifth embodiment of a sink type differential voltage-to-current converter circuit according to the present invention.
Figure 35:
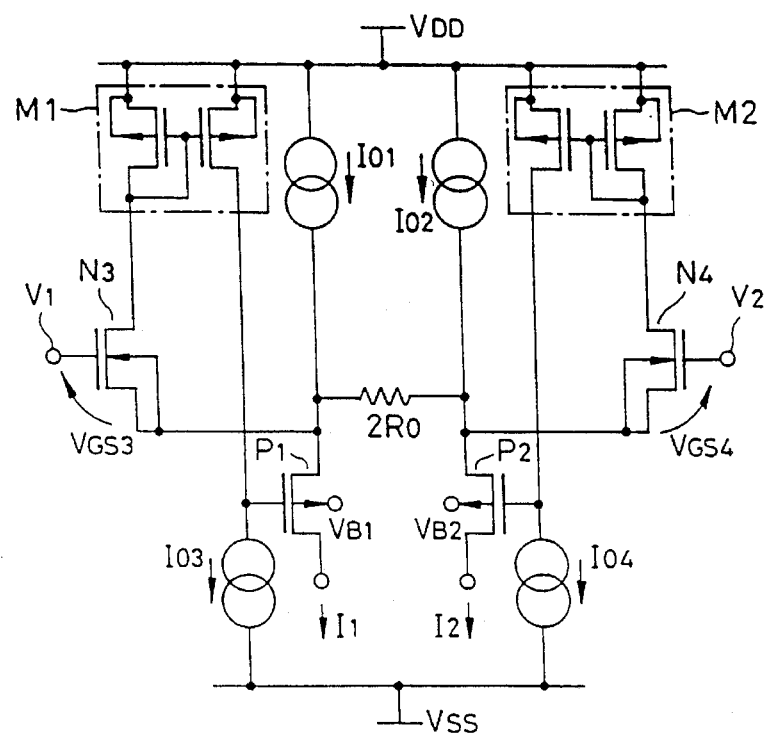
FIG. 35 is an illustration showing a circuit construction of the fifth embodiment of a source type differential voltage-to-current converter circuit according to the present invention.
Figure 36:
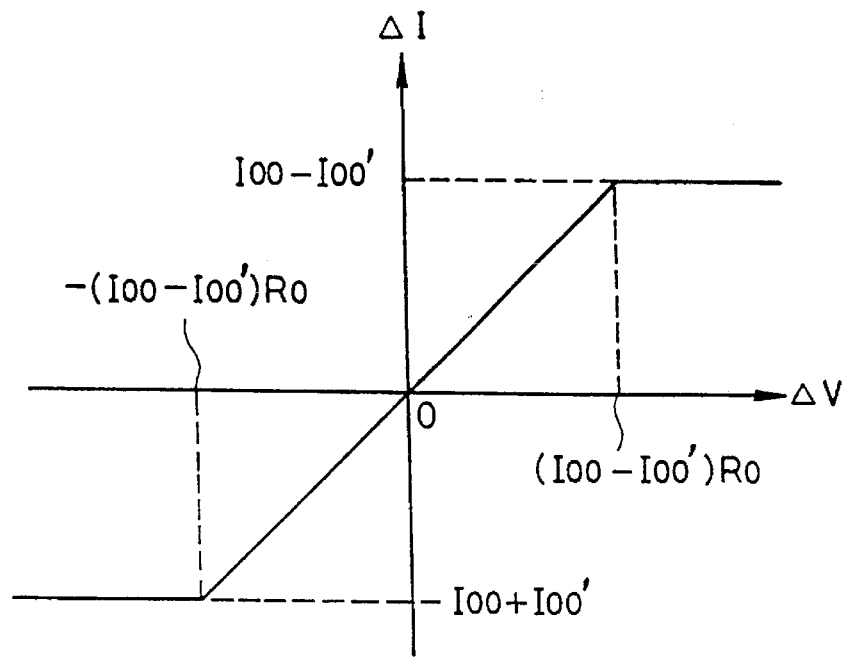
FIG. 36 is an illustration showing an input/output characteristics of the fifth embodiment of the differential voltage-to-current converter circuit according to the invention.
Figure 37:
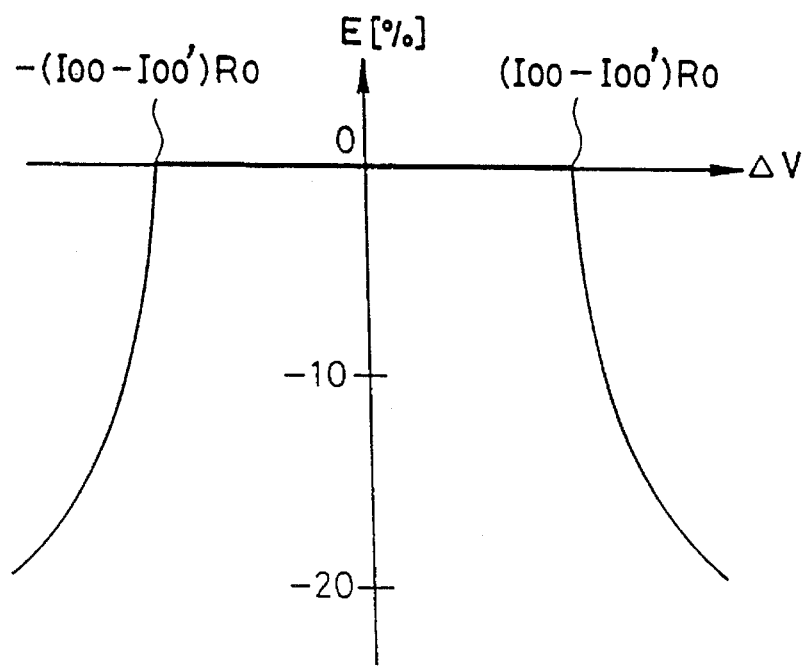
FIG. 37 is an illustration showing a non-linear characteristics of the fifth embodiment of the differential voltage-to-current converter circuit of the invention.

FIG. 34 shows the circuit construction of a sink type MOS differential voltage-to-current converter circuit and FIG. 35 shows the circuit construction of a source type MOS differential voltage-to-current converter circuit.

The source terminals of the third and fourth MOSFETs are connected to the source terminals of the first and second MOSFETs. The drain terminals of the third and fourth MOSFETs are connected to respective input sides of the first and second current mirror circuits $M_1$ and $M_2$. The output terminals of the first and second current-mirror circuits $M_1$ and $M_2$ are connected to the third and fourth constant current sources and gate terminals of the first and second MOSFETs. Accordingly, when the input $V_1$ is risen for example, the gate-source terminal voltage $V_{GS3}$ is temporarily increased. Associating therewith, the drain current of $N_3$ and the input current of $M_1$ are also risen. Here, since $I_{03}$ is constant, the gate voltage of $N_1$ is swiftly risen. Therefore, $I_1$ is increased. Subsequently, the voltages at the source terminals of $N_1$ and $N_2$ are risen. This increasing of $V_{GS3}$ can be suppressed. As can be appreciated, such operation is a kind of feedback operation to make the operation of the differential voltage-to-current converter circuit stable. In short, as far as $M_1$ is in operation in the saturating region, the gate voltage of $N_1$ converges to the voltage to maintain the current flowing through $N_2$ constant. Therefore, the voltage $V_{GS3}$ between $V_1$ and the source terminal of $N_1$ and the voltage $V_{GS4}$ between $V_2$ and the source terminal of $N_2$ become constant.

As set forth above, in the same reason, the output current and linearity equivalent to the first and second embodiments can be obtained.

FIGS. 38 to 41 show the circuit construction, and input/output characteristics of the sixth embodiment of the differential voltage-to-current converter circuit according to the present invention.

Figure 38:
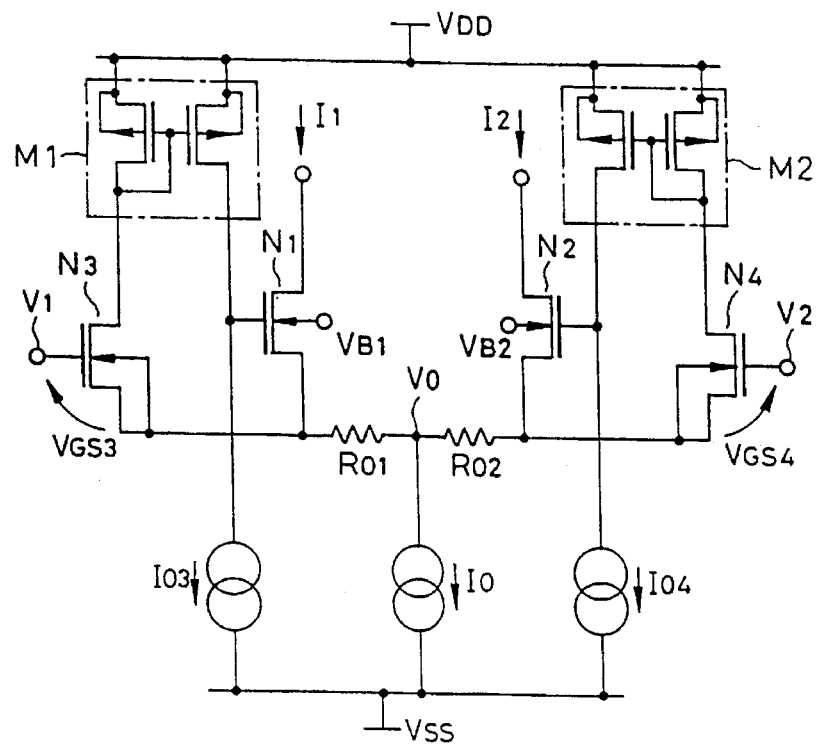
FIG. 38 is an illustration showing a circuit construction of the sixth embodiment of a sink type differential voltage-to-current converter circuit according to the present invention.
Figure 39:
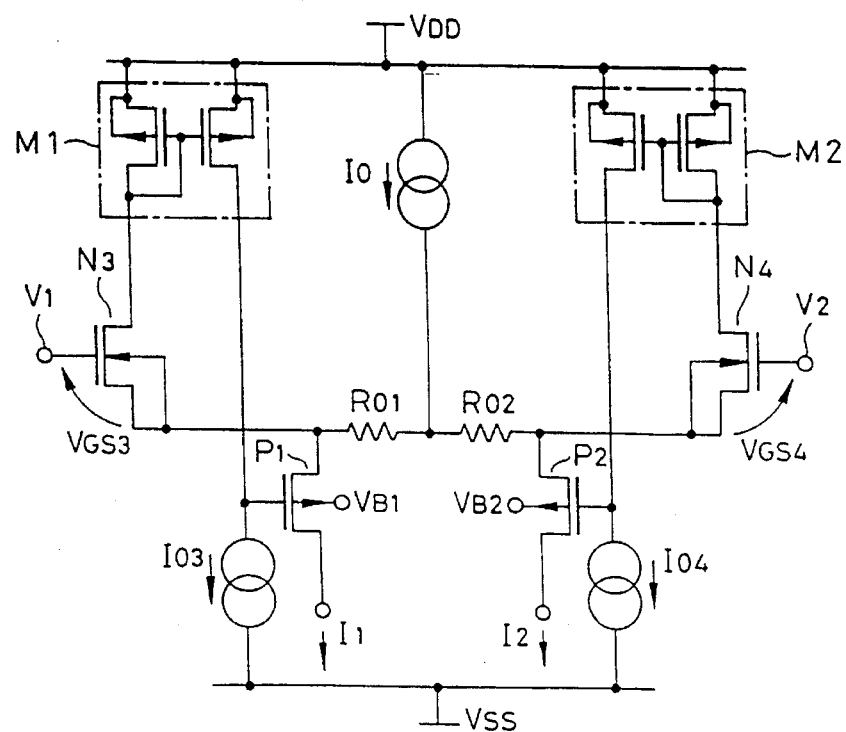
FIG. 39 is an illustration showing a circuit construction of the sixth embodiment of a source type differential voltage-to-current converter circuit according to the present invention.
Figure 40:
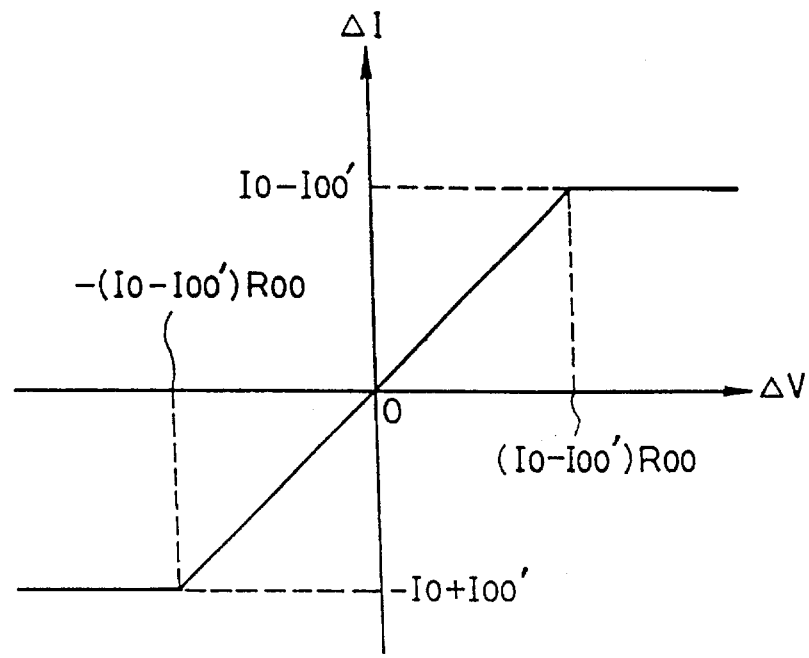
FIG. 40 is an illustration showing an input/output characteristics of the sixth embodiment of the differential voltage-to-current converter circuit according to the invention.
Figure 41:
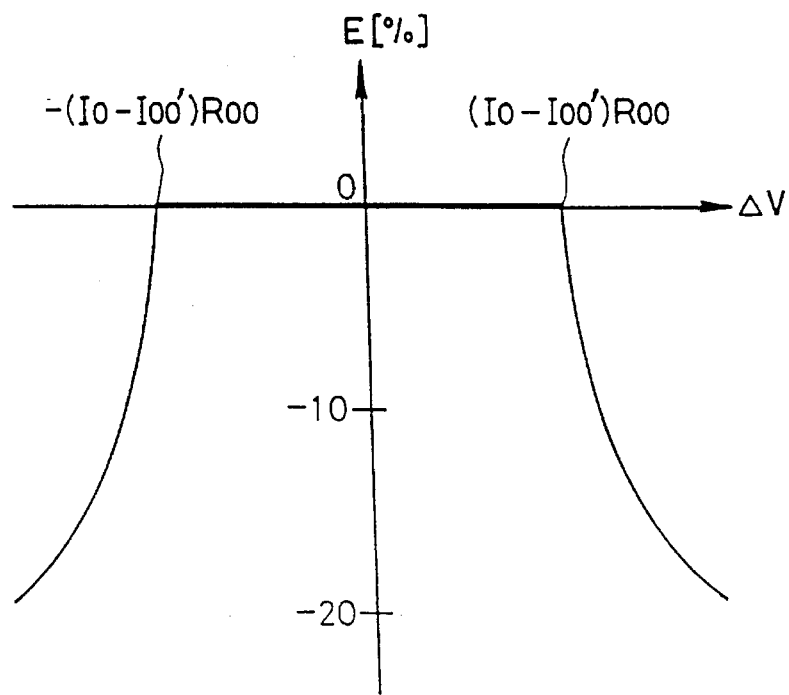
FIG. 41 is an illustration showing a non-linear characteristics of the sixth embodiment of the differential voltage-to-current converter circuit of the invention.

The shown embodiment of the differential voltage-to-current converter circuit is constructed by connecting one terminals of the first and second resistors $R_{01}$ and $R_{02}$ to the source terminals of the first and second MOSFETs ($N_1$ and $N_2$ or $P_1$ and $P_2$). The other terminals of the first and second resistors $R_{01}$ and $R_{02}$ are connected in common. The constant current source $I_0$ is connected to the junction of the common connection between the first and second resistors $R_{01}$ and $R_{02}$. FIG. 38 shows the circuit construction of a sink type MOS differential voltage-to-current converter circuit and FIG. 39 shows the circuit construction of a source type MOS differential voltage-to-current converter circuit. Here, respective signs in FIGS. 38 and 39 have the same meaning to the corresponding signs in FIG. 16 which illustrates the second prior art. $N_3$ and $N_4$ represent third and fourth NMOSFETs. The constant current source can be constructed as shown in FIGS. 30, 31, 32 and 33.

Discussion will be given hereinafter with respect to the operation of the circuit construction of FIG. 38. The source terminals of the third and fourth MOSFETs are connected to the source terminals of the first and second MOSFETs. The drain terminals of the third and fourth MOSFETs are connected to respective input sides of the first and second current mirror circuits $M_1$ and $M_2$. The output terminals of the first and second current-mirror circuits $M_1$ and $M_2$ are connected to the third and fourth constant current sources and the gate terminals of the first and second MOSFETs. Accordingly, when the input $V_1$ is risen for example, the gate-source terminal voltage $V_{GS3}$ is temporarily increased. Associating therewith, the drain current of $N_3$ and the input current of $M_1$ are also risen. Here, since $I_{03}$ is constant, the gate voltage of $N_1$ is swiftly risen. Therefore, $I_1$ is increased. Subsequently, the voltages at the source terminals of $N_1$ and $N_3$ are risen. This increasing of $V_{GS3}$ can be suppressed. As can be appreciated, such operation is a kind of feedback operation to make the operation of the differential voltage-to-current converter circuit stable. In short, as far as $M_1$ is in operation in the saturating region, the gate voltage of $N_1$ converges to the voltage to maintain the current flowing through $N_2$ constant. Therefore, the voltage $V_{GS3}$ between $V_1$ and the source terminal of $N_1$ and the voltage $V_{GS4}$ between $V_2$ and the source terminal of $N_2$ become constant.

As set forth above, in the same reason, the output current and linearity equivalent to the first and second embodiments can be obtained.

As set forth above, the MOS differential voltage-to-current converter circuit according to the present invention establishes the negative feedback with the shown construction, in which the source (drain) resistors are provided, the source(drain terminals of the first and second MOSFETs are connected to the source terminals of the third and fourth MOSFETs, the drain terminals of the third and fourth MOSFETs are respectively connected to the input sides of the first and second current mirror circuits $M_1$ and $M_2$, and the outputs of the current-mirror circuits $M_1$ and $M_2$ are connected to the constant current source and the gate terminals of the first and second MOSFETs.

As a result, as long as the operation is taken placed in the region where $M_1$ and $M_2$ are saturated, the gate voltage of $N_1$ and $N_2$ are converged at the voltage where the current $I_{03}$ flowing through $N_3$ and the current $I_{04}$ flowing through $N_4$ are equal to each other so that $V_1$, the voltage $V_{GS3}$ between the source terminal of the $N_1$ and the voltage $V_{GS4}$ between $V_2$ and the voltage $V_2$ and the source terminal of $N_4$ become constant. Furthermore, there is provided the first and second signal transmission means which has the inputs connected to the respective of the first and second input terminals and/or to the drain terminals of the third and fourth MOSFETs, and the outputs connected to respective gate terminals of the first and second MOSFETs. By the presence of the signal transmission means, the mutual conductance $g_m$ of the differential voltage-to-current converter circuit can be determined only by the resistance value $2R_0$, $R_{01}+R_{02}$ between the source (drain) terminals. Also, even when the differential output current is increased associating with increasing of the differential input voltage, the non-linearity E can be held 0.

Therefore, with the differential current-to-voltage converter circuit according to the present invention, it becomes possible to avoid increasing of non-linearity due to influence of various property of the differential MOSFET (such as, non-linearity of $I_D$-$V_{GS}$ characteristics, fluctuation of the gain coefficient β, variation of the threshold voltage $V_T$ due to backgate effect, saturation of MOS due to end channel effect and so forth, variation of the $I_D$-$V_{DS}$ characteristics within the non-saturated range and so forth), within a predetermined range of the differential input voltage.

Characteristics variation factor of the MOSFET is quite large in comparison with that of the bipolar transistor and is specific to the MOSFET. Conventionally, such characteristics variation was inevitable in the MOSFET circuit. According to the present invention, even when the circuit elements located at symmetric positions on the circuit diagram do not have the same characteristics, the relationship between the differential input voltage ΔV and the voltage $ΔV_R$ at opposite ends of the source (drain) resistor and the relationship between the differential input voltage ΔV and the differential output current ΔI can be maintained linear without depending upon the characteristics variation of the MOSFETs. Therefore, the linearity of the differential voltage-to-current converter can be significantly improved.

Furthermore, the differential voltage-to-current converter circuit can be fabricated through a MOS process, which can simply the fabrication process contributing lowering of the production cost.

Although the invention has been illustrated and described with respect to exemplary embodiment thereof, it should be understood by those skilled in the art that the foregoing and various other changes, omissions and additions may be made therein and thereto, without departing from the spirit and scope of the present invention. Therefore, the present invention should not be understood as limited to the specific embodiment set out above but to include all possible embodiments which can be embodies within a scope encompassed and equivalents thereof with respect to the feature set out in the appended claims.

What is claimed is:

1. A MOS differential voltage-to-current converter circuit comprising:

first and second MOS transistors;

a resistor connected between the sources of said first and second MOS transistors;

a first constant current source for supplying operation current for said first and second MOS transistors;

third and fourth MOS transistors, the source of said third MOS transistor connected to the source of said first MOS transistor and the source of said fourth MOS transistor connected to the source of said second MOS transistor, said third and fourth MOS transistors receiving a differential input voltage at the gates thereof;

a first differential amplifier circuit receiving a gate input and a drain output of said third MOS transistor as inputs and applying a differential output to the gate of said first MOS transistor; and a second differential amplifier circuit receiving a gate input and a drain output of said fourth MOS transistor as inputs and applying a differential output to the gate of said second MOS transistor, the current flowing through said first and second MOS transistors providing a differential output of said MOS differential voltage-to-current converter circuit.

2. The MOS differential voltage-to-current converter circuit as set forth in claim 1, wherein said first constant current source supplies the operation current for said first and second MOS transistors.

3. The MOS differential voltage-to-current converter circuit as set forth in claim 1, wherein said first and second MOS transistors are opposite in conductivity from said third and fourth MOS transistors.

4. The MOS voltage-to-current converter circuit as set forth in claim 1, wherein said resistor comprises first and second resistor elements which are connected in series between the sources of said first and second MOS transistors, and said first constant current source supplies the operation current at the junction of the series connection of said first and second resistor elements.

5. A MOS differential voltage-to-current converter circuit comprising:

first and second MOS transistors;

a resistor connected between the drains of said first and second MOS transistors;

a first constant current source for supplying operation current for said first and second MOS transistors;

third and fourth MOS transistors, the source of said third MOS transistor connected to the drain of said first MOS transistor and the source of said fourth MOS transistor connected to the drain of second MOS transistor, said third and fourth MOS transistors receiving a differential input voltage at the gates thereof;

a first differential amplifier circuit receiving a gate input and a drain output of said third MOS transistor as inputs and applying a differential output to the gate of said first MOS transistor; and a second differential amplifier circuit receiving a gate input and a drain output of said fourth MOS transistor as inputs and applying a differential output to the gate of said second MOS transistor, the current flowing through said first and second MOS transistors providing a differential output of said MOS differential voltage-to-current converter circuit.

6. The MOS differential voltage-to-current converter circuit as set forth in claim 5, wherein said first constant current source supplies the operation current for said first and second MOS transistors.

7. The MOS differential voltage-to-current converter circuit as set forth in claim 5, wherein said first and second MOS transistors are opposite in conductivity from said third and fourth MOS transistors.

8. The MOS differential voltage-to-current converter circuit as set forth in claim 5, wherein said resistor comprises first and second resistor elements which are connected in series between the drains of said first and second MOS transistors, and said first constant current source supplies the operation current at the junction of the series connection of said first and second resistor elements.

* * * * *

UNITED STATES PATENT AND TRADEMARK OFFICE
CERTIFICATE OF CORRECTION

PATENT NO.   : 5,552,730
DATED        : September 3, 1996
INVENTOR(S)  : Koji Deguchi Page 1 of 2

It is certified that error appears in the above-identified patent and that said Letters Patent is hereby corrected as shown below:

Column 3,
Line 30, change "$\sqrt{(2 \cdot I_{oo}/\beta)} - Ro$" to -- $-\sqrt{(2 \cdot I_{oo}/\beta)} - Ro$ --;

Column 4,
Line 30, change "$\sqrt{(2 \cdot I_o/\beta)} - Roo$" to -- $-\sqrt{(2 \cdot I_o/\beta)} - Roo$ --;

Column 5,
Line 30, "$1/g_{mmax} \, d\Delta V/d\Delta I$" to -- $1/g_{mmax} = d\Delta V/d\Delta I$ --;

Line 32, in the equation (22) change "$E(1/g_{mmax})(\Delta I/\Delta V)$" to
-- $E = (1/g_{mmax})(\Delta I/\Delta V)$ --;

Column 12,
Line 51, in the equation (25–b) change "$2 \cdot I_{00}$" to -- $2 \cdot I_{03}$ --;
Line 63, in the equation (28–d) change "b= (" to -- b= – ( --;

Column 13,
Line 5, in the equation (29–c) change "–1/2Ro–" to -- 1/2Ro• --;
Line 10, in the equation (30–a) change "$\Delta V/Ro \, 1/Ro –$" to -- $\Delta V/Ro – 1/Ro \bullet$ --;
Line 43, in the equation (33–a) change "$1/g_{mmax} \, d\Delta V/d\Delta I$" to -- $1/g_{mmax} = d\Delta V/d\Delta I$ --;

Line 51, in the equation (35) change " ( Ioo-Ioo') " to -- ( Ioo-Ioo')) --;

Column 16,
Line 42, in the equation (38–b) change "$\sqrt{(2 \cdot I_{04}/\beta_3)}$" to -- $\sqrt{(2 \cdot I_{04}/\beta_4)}$ --;
Line 57, in the equation (42–b) change "$(R_{01}-R_{02})/(R_{01}+R_{02})I_0$" to
-- $(R_{01}-R_{02})/(R_{01}+R_{02})I_0$ --;
Line 63, in the equation (42–c) change "$2/(R_0+R_1)$" to -- $2/(R_1+R_2)$ --;
Line 63, in the equation (42–c) change "– (" to -- • ( --;

Line 63, in the equation (42–c) change "$\sqrt{(2 \cdot I_{04}/\beta_4)}$" to -- $\sqrt{(2 \cdot I_{03}/\beta_3)}$ --;

Line 63, in the equation (42–c) change "$\sqrt{(2 \cdot I_{03}/\beta_3)}$" to -- $\sqrt{(2 \cdot I_{04}/\beta_4)}$ --;

UNITED STATES PATENT AND TRADEMARK OFFICE
CERTIFICATE OF CORRECTION

PATENT NO. : 5,552,730
DATED : September 3, 1996
INVENTOR(S) : Koji Deguchi

It is certified that error appears in the above-identified patent and that said Letters Patent is hereby corrected as shown below:

<u>Column 17</u>,
Line 4, in the equation (42-f) change "$(R_{01}-R_{02})/(R_{01}+R_{02})I_0$" to $--(R_{01}-R_{02})/(R_{01}+R_{02})I_0 --$; and Line 19, in the equation (46-a) change "$1/g_{mmax}\ d\Delta V/d\Delta I$" to $--1/g_{mmax} = d\Delta V/d\Delta I --$.

Signed and Sealed this

Fourteenth Day of May, 2002

*Attest:*

*Attesting Officer*

JAMES E. ROGAN
*Director of the United States Patent and Trademark Office*